United States Patent
Hong et al.

(10) Patent No.: US 10,446,774 B2
(45) Date of Patent: Oct. 15, 2019

(54) SEMICONDUCTOR DEVICES

(71) Applicant: Samsung Electronics Co., Ltd., Suwon-si, Gyeonggi-do (KR)

(72) Inventors: Yi-Koan Hong, Yongin-si (KR); Kwang-Jin Moon, Hwaseong-si (KR); Nae-In Lee, Seoul (KR); Ho-Jin Lee, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 24 days.

(21) Appl. No.: 15/870,922

(22) Filed: Jan. 13, 2018

(65) Prior Publication Data
US 2018/0366671 A1 Dec. 20, 2018

(30) Foreign Application Priority Data
Jun. 20, 2017 (KR) .................. 10-2017-0077788

(51) Int. Cl.
*H01L 23/48* (2006.01)
*H01L 51/44* (2006.01)
*H01L 25/065* (2006.01)
*H01L 23/532* (2006.01)
*H01L 23/538* (2006.01)
(Continued)

(52) U.S. Cl.
CPC .......... *H01L 51/444* (2013.01); *H01L 21/768* (2013.01); *H01L 23/538* (2013.01); *H01L 23/5329* (2013.01); *H01L 23/53223* (2013.01); *H01L 23/53238* (2013.01); *H01L 23/53276* (2013.01); *H01L 24/80* (2013.01); *H01L 25/0657* (2013.01); *H01L 51/0048* (2013.01); *B82Y 10/00* (2013.01); *B82Y 99/00* (2013.01); *H01L 2224/16145* (2013.01);
(Continued)

(58) Field of Classification Search
CPC ............... H01L 23/538; H01L 23/5329; H01L 25/0657; H01L 51/444
See application file for complete search history.

(56) References Cited

U.S. PATENT DOCUMENTS 8,533,945 B2    9/2013  Nihei et al.
8,647,922 B2    2/2014  Zhou et al.
(Continued)

FOREIGN PATENT DOCUMENTS

KR    101025728 B1    4/2011

*Primary Examiner* — Hoa B Trinh
(74) *Attorney, Agent, or Firm* — Renaissance IP Law Group LLP

(57) ABSTRACT

A semiconductor device includes a first conductive pattern at an upper portion of a first insulating interlayer on a first substrate, a first plurality of conductive nanotubes (CNTs) extending vertically, a second conductive pattern at a lower portion of a second insulating interlayer beneath a second substrate, and a second plurality of CNTs extending vertically. A lower surface of the second insulating interlayer contacts an upper surface of the first insulating interlayer. At least a portion of a sidewall of each of the first plurality of CNTs is covered by the first conductive pattern, and at least a portion of a sidewall of each of the second plurality of CNTs is covered by the second conductive pattern. The first and second conductive patterns vertically face each other, and at least one of the first plurality of CNTs and at least one of the second plurality of CNTs contact each other.

19 Claims, 27 Drawing Sheets

(51) Int. Cl.
*H01L 21/768* (2006.01)
*H01L 51/00* (2006.01)
*H01L 23/00* (2006.01)
B82Y 99/00 (2011.01)
B82Y 10/00 (2011.01)

(52) U.S. Cl.
CPC ............... *H01L 2224/16227* (2013.01); *H01L 2225/06517* (2013.01); *H01L 2225/06524* (2013.01)

(56) References Cited

U.S. PATENT DOCUMENTS

| | | |
|---|---|---|
| 9,209,136 B2 | 12/2015 | Barth |
| 9,305,838 B2 | 4/2016 | Narwankar et al. |
| 2009/0266590 A1 | 10/2009 | Aoi |
| 2011/0039459 A1* | 2/2011 | Yancey .................. B82Y 10/00 439/884 |
| 2012/0202347 A1 | 8/2012 | Ready et al. |
| 2012/0306096 A1 | 12/2012 | Kim et al. |
| 2016/0086889 A1 | 3/2016 | Katagiri et al. |
| 2016/0225694 A1 | 8/2016 | Barth et al. |

* cited by examiner

SEMICONDUCTOR DEVICES

CROSS-REFERENCE TO RELATED APPLICATION

This application claims priority under 35 USC § 119 to Korean Patent Application No. 10-2017-0077788, filed on Jun. 20, 2017 in the Korean Intellectual Property Office (KIPO), the contents of which are herein incorporated by reference in their entirety.

BACKGROUND

1. Field

Exemplary embodiments disclosed herein relate to semiconductor devices. More particularly, exemplary embodiments disclosed herein relate to semiconductor devices including multiple substrates sequentially stacked.

2. Description of the Related Art

In order to highly integrate a semiconductor device, chips, packages, or substrates may be stacked vertically. Thus, chip-on-chip (COC) structure or package-on-package (POP) structure may be adopted. When substrates having insulating interlayers containing conductive patterns therein are bonded with each other to form a stacked structure, the conductive patterns need to be well-attached to each other so that the semiconductor device may have a high reliability.

SUMMARY

Exemplary embodiments provide a high reliability semiconductor device.

According to an exemplary embodiment of the present inventive concept, a semiconductor device is provided. The semiconductor device may include a first conductive pattern, first plurality of carbon nanotubes (CNTs), a second conductive pattern, and second plurality of CNTs. The first conductive pattern may be contained at an upper portion of a first insulating interlayer on a first substrate. The first plurality of CNTs may extend in a vertical direction relative to an upper surface of the first substrate, and at least a portion of a sidewall of each of the first plurality of CNTs may be covered by the first conductive pattern. The second conductive pattern may be contained at a lower portion of a second insulating interlayer beneath a second substrate, and a lower surface of the second insulating interlayer may contact an upper surface of the first insulating interlayer. The second plurality of CNTs may extend in the vertical direction, and at least a portion of a sidewall of each of the second plurality of CNTs may be covered by the second conductive pattern. The first and second conductive patterns may face each other in the vertical direction, and at least one of the first plurality of CNTs and at least one of the second plurality of CNTs may contact each other.

According to an exemplary embodiment of the present inventive concept, there is provided a semiconductor device. The semiconductor device may include a first conductive pattern, first plurality of carbon nanotubes (CNTs), a second conductive pattern, and second plurality of CNTs. The first conductive pattern may be contained at an upper portion of a first insulating interlayer on a first substrate. The first plurality of CNTs may be formed on a first recess on an upper surface of the first conductive pattern, and each of the first plurality of CNTs may extend in a vertical direction relative to an upper surface of the first substrate. The second conductive pattern may be contained at a lower portion of a second insulating interlayer beneath a second substrate, and a lower surface of the second insulating interlayer may contact an upper surface of the first insulating interlayer. The second plurality of CNTs may be formed beneath a second recess beneath a lower surface of the second conductive pattern, and each of the second plurality of CNTs may extend in the vertical direction. The first and second conductive patterns may face each other in the vertical direction, and at least one of the first plurality of CNTs and at least one of the second plurality of CNTs may contact each other.

According to an exemplary embodiment of the present inventive concept, there is provided a semiconductor device. The semiconductor device may include a first conductive pattern, first plurality of carbon nanotubes (CNTs), a second conductive pattern, and second plurality of CNTs. The first plurality of CNTs may extend through the first conductive pattern in a vertical direction, and each of the first plurality of CNTs may protrude from an upper surface of the first conductive pattern. The second plurality of CNTs may extend through the second conductive pattern in the vertical direction, and each of the second plurality of CNTs may protrude from a lower surface of the second conductive pattern. An upper portion of at least one of the first plurality of CNTs and a lower portion of at least one of the second plurality of CNTs may contact each other.

In the methods of manufacturing the semiconductor device in accordance with an exemplary embodiment of the present inventive concept, when the insulating interlayers and conductive patterns contained by the insulating interlayers on respective substrates are bonded with each other, the adhesion between the conductive patterns may increase due to the CNTs in the conductive patterns, the contact resistance therebetween may decrease, and the reliability of the electrical connection therebetween may be enhanced.

BRIEF DESCRIPTION OF THE DRAWINGS

Exemplary embodiments of the present inventive concept will be more clearly understood from the following detailed description taken in conjunction with the accompanying drawings. FIGS. 1 to 26 represent non-limiting, example embodiments as described herein.

FIGS. 1, 2, 3, 4A, 4B, 4C, 5, 6A, 6B, 6C, and 7 are cross-sectional views illustrating stages of a method of manufacturing a semiconductor device in accordance with an exemplary embodiment of the present inventive concept;

FIGS. 8 to 9 are cross-sectional views illustrating stages of a method of manufacturing a semiconductor device in accordance with an exemplary embodiment of the present inventive concept;

FIGS. 10, 11, 12A, 12B, 12C, and 13 are cross-sectional views illustrating stages of a method of manufacturing a semiconductor device in accordance with an exemplary embodiment of the present inventive concept;

FIGS. 14 to 16 are cross-sectional views illustrating stages of a method of manufacturing a semiconductor device in accordance with an exemplary embodiment of the present inventive concept;

FIGS. 17 to 18 are cross-sectional views illustrating stages of a method of manufacturing a semiconductor device in accordance with an exemplary embodiment of the present inventive concept;

FIGS. 19 to 22 are cross-sectional views illustrating stages of a method of manufacturing a semiconductor device in accordance with an exemplary embodiment of the present inventive concept;

FIGS. 23 to 25 are cross-sectional views illustrating stages of a method of manufacturing a semiconductor device in accordance with an exemplary embodiment of the present inventive concept; and FIG. 26 is a cross-sectional view illustrating a semiconductor device in accordance with an exemplary embodiment of the present inventive concept.

DESCRIPTION OF EMBODIMENTS

FIGS. 1, 2, 3, 4A, 4B, 4C, 5, 6A, 6B, 6C, and 7 are cross-sectional views illustrating stages of a method of manufacturing a semiconductor device in accordance with exemplary embodiment of the present inventive concept.

Figure 1:
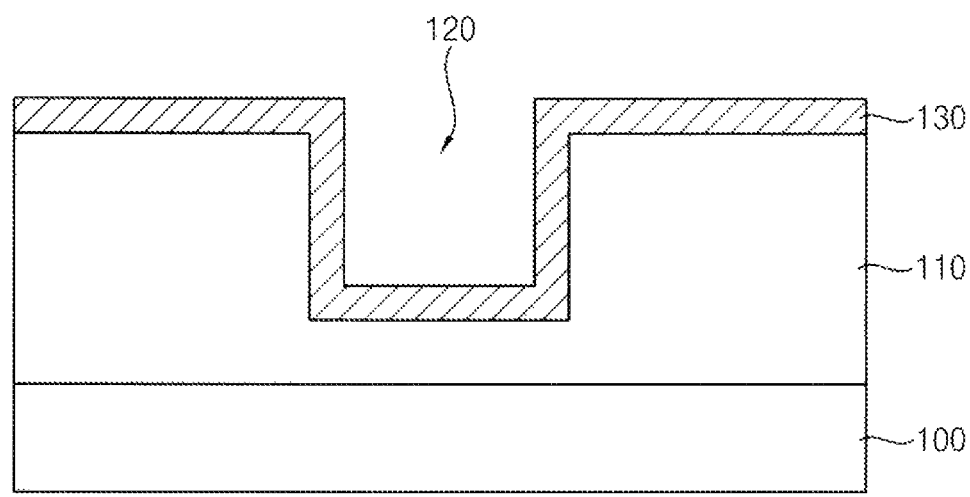

Referring to FIG. 1, a first insulating interlayer 110 may be formed on a first substrate 100, an upper portion of the first insulating interlayer 110 may be removed to form a first trench 120, and a first barrier layer 130 may be formed on an inner wall of the first trench 120 and an upper surface of the first insulating interlayer 110.

The substrate 100 may include a semiconductor material, e.g., silicon, germanium, silicon-germanium, etc., or III-V semiconductor compounds, e.g., GaP, GaAs, GaSb, etc. In an exemplary embodiment, the substrate 100 may be a silicon-on-insulator (SOI) substrate, or a germanium-on-insulator (GOI) substrate.

The first insulating interlayer 110 may include silicon oxide or a low-k dielectric material.

The first barrier layer 130 may include a metal nitride, e.g., titanium nitride, tantalum nitride, etc., and/or a metal, e.g., titanium, tantalum, etc.

Figure 2:
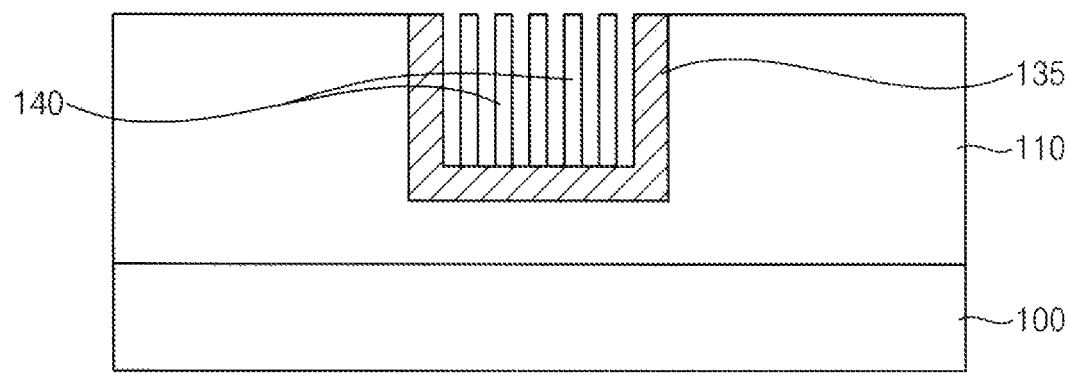

Referring to FIG. 2, the first barrier layer 130 may be partially removed to form a first barrier pattern 135 on the inner wall of the first trench 120, and a first carbon nanotube (CNT) structure 140 may be formed on a surface of the first barrier pattern 135.

In an exemplary embodiment, a portion of the first barrier layer 130 on a top surface of the first insulating interlayer 110 may be removed by a chemical mechanical polishing (CMP) process and/or an etch back process to form the first barrier pattern 135 on the inner wall of the first trench 120. Alternatively, a photoresist pattern (not shown) covering the first trench 120 may be formed, and the first barrier layer 130 may be patterned using the photoresist pattern as an etching mask to form the first barrier pattern 135 on the inner wall of the first trench 120.

In an exemplary embodiment, the first CNT 140 may be formed by a chemical vapor deposition (CVD) process, and may be selectively formed only on the surface of the first barrier pattern 135. The CVD process may be performed using carbon and hydrogen, and thus the first CNT 140 may include a material having a chemical formula $C_xH_y$.

In an exemplary embodiment, the first CNT 140 may be formed only on a surface of the first barrier pattern 135 on a bottom of the first trench 120, and may extend in a vertical direction relative to an upper surface of the substrate 100 (e.g., horizontally-oriented, as illustrated in the FIGS.). A top surface of the first CNT 140 may be substantially coplanar with the top surface of the first insulating interlayer 110, however, the inventive concept may not be limited thereto. In an exemplary embodiment, a plurality of first CNTs 140 may be formed in the first trench 120, and each of the first plurality of CNTs 140 may be conductive.

Figure 3:
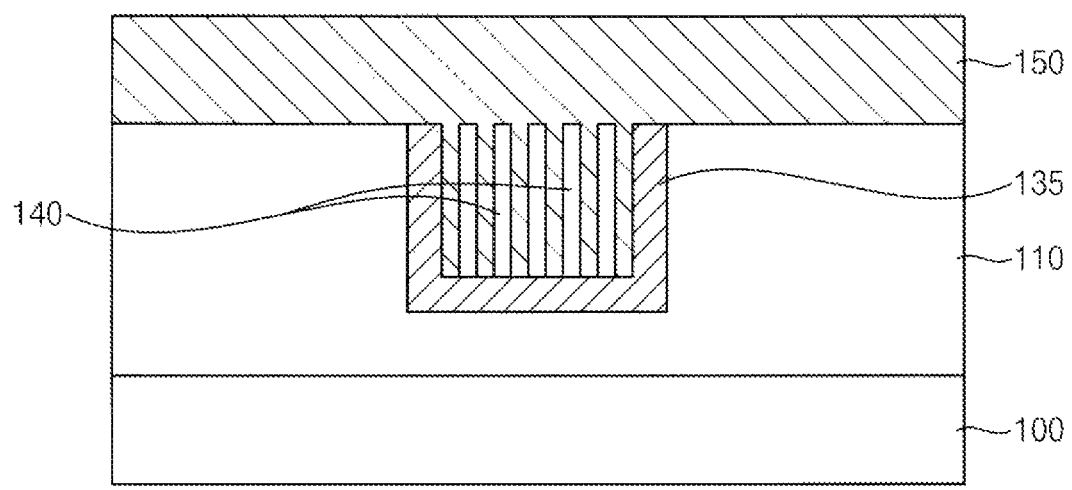

Referring to FIG. 3, a seed layer (not shown) may be formed on the first barrier pattern 135, the first plurality of CNTs 140, and the first insulating interlayer 110, and a first conductive layer 150 may be formed on the seed layer to sufficiently fill a remaining portion of the first trench 120.

The first conductive layer 150 may include a metal, e.g., copper, aluminum, etc., and may be formed by an electroplating process or an electroless plating process.

Figure 4A:
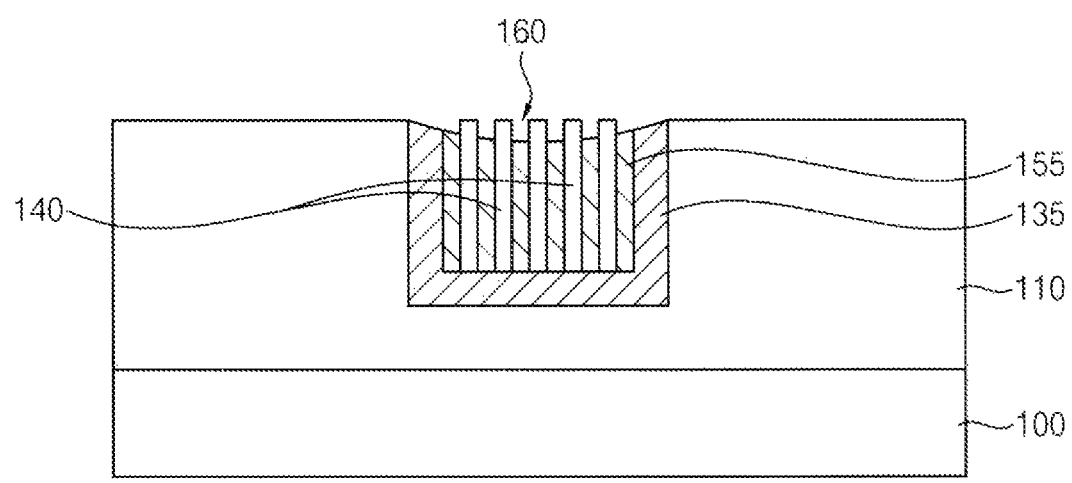

Referring to FIG. 4A, an upper portion of the first conductive layer 150 may be planarized until the top surface of the first insulating interlayer 110 is exposed to form a first conductive pattern 155 in the first trench 120.

In an exemplary embodiment, the planarization process may be performed by a CMP process, and when the CMP process is performed, dishing may occur. Thus, a height of an upper surface of the first conductive pattern 155 and/or a height of a top surface of the first barrier pattern 135 may not be equal to a height of the top surface of the first insulating interlayer 110, and a first recess 160 may be formed on the first conductive pattern 155 and/or the first barrier pattern 135.

During the planarization process, heights of the top surfaces of the first plurality of CNTs 140, which may be substantially equal to the height of the top surface of the first insulating interlayer 110, may be kept. Thus, most of a sidewall of each of the first plurality of CNTs 140 may be covered by the first conductive pattern 155, however, an upper sidewall of each of the first plurality of CNTs 140 may protrude from the upper surface of the first conductive pattern 155.

Figure 4B:
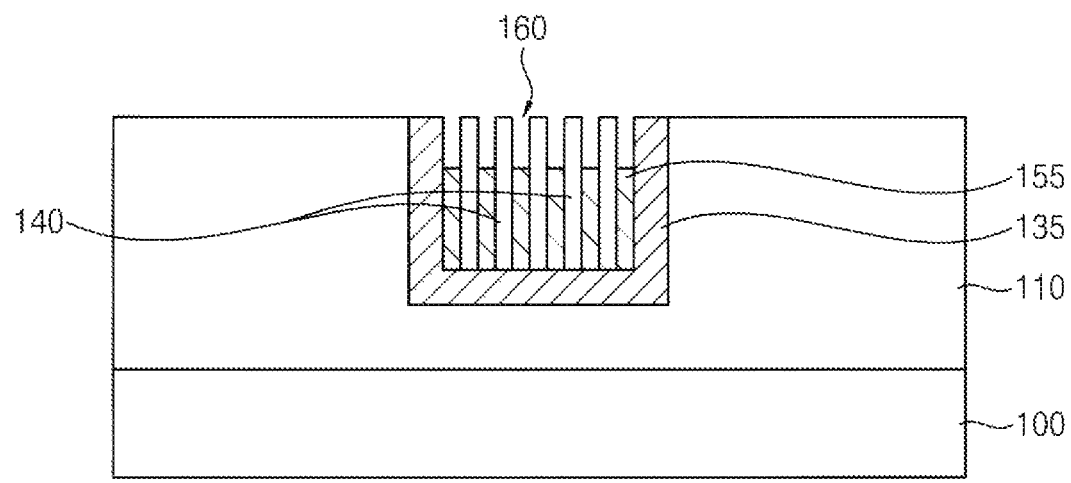
Figure 4C:
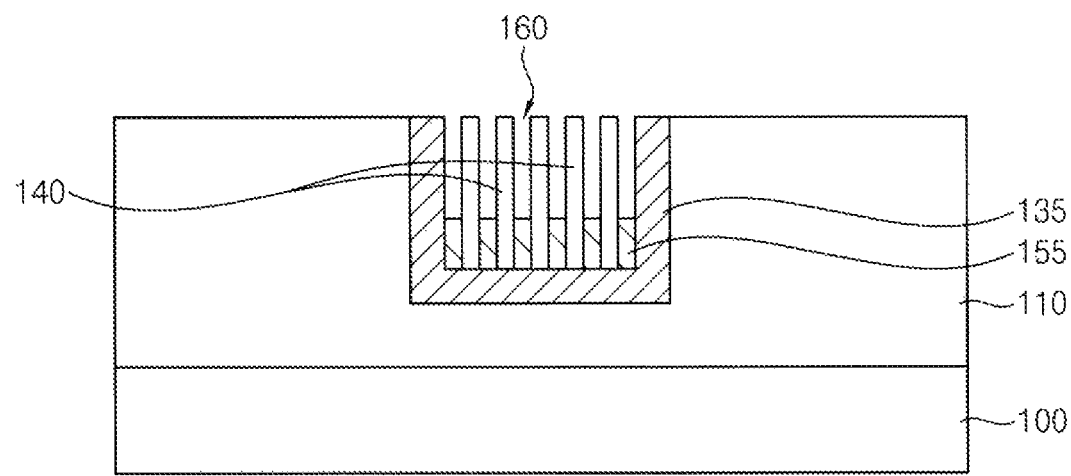

Referring to FIGS. 4B and 4C, the first recess 160 may have a depth deeper than that of FIG. 4A.

In an exemplary embodiment, the first recess 160 shown in FIGS. 4A and 4B may have a depth of about 20 Å to about 5,000 Å.

Figure 5:
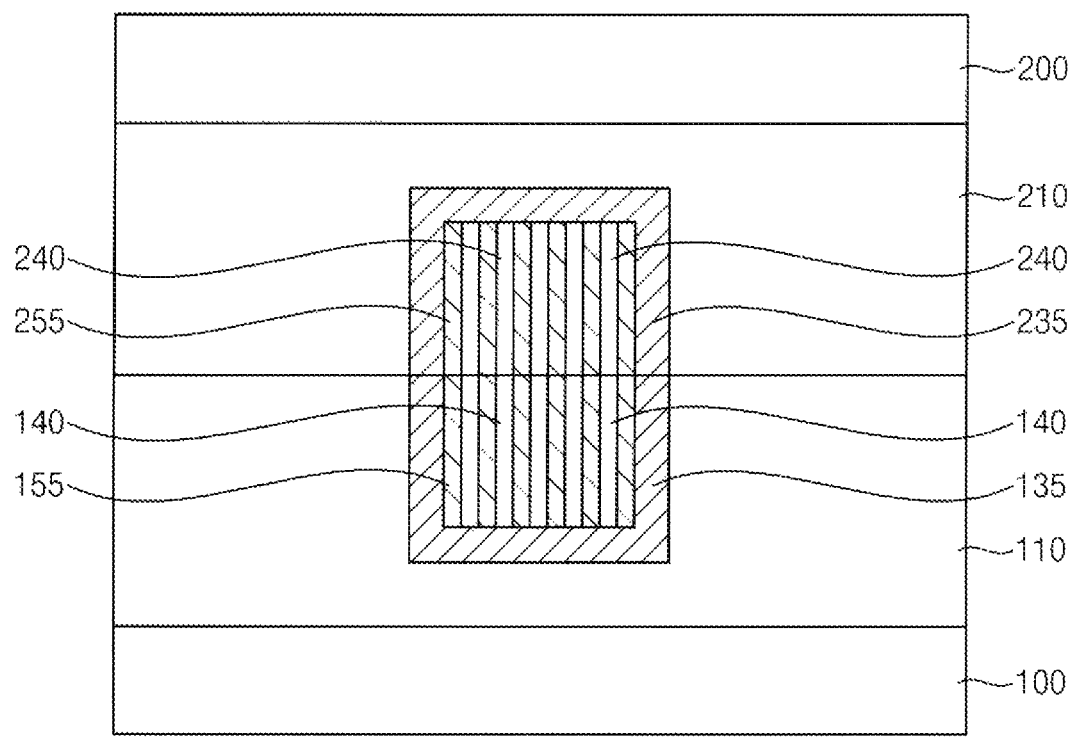

Referring to FIG. 5, processes substantially the same as or similar to those illustrated with reference to FIGS. 1 to 4 may be performed again on a second substrate 200.

Thus, a second insulating interlayer 210 may be formed on the second substrate 200, an upper portion of the second insulating interlayer 210 may be removed to form a second trench (not shown), and a second barrier pattern 235 may be formed on an inner wall of the second trench. A plurality of second CNTs 240 (e.g., conductive CNTs) may be formed on a surface of the second barrier pattern 235 on a bottom of the second trench, and may extend in a vertical direction relative to an upper surface of the second substrate 200. A top surface of each of the second plurality of CNTs 240 may be substantially coplanar with a top surface of the second insulating interlayer 210.

A second conductive layer may be formed to sufficiently fill a remaining portion of the second trench, and an upper portion of the second conductive layer may be planarized until the top surface of the second insulating interlayer 210 is exposed to form a second conductive pattern 255.

In an exemplary embodiment, a height of an upper surface of the second conductive pattern 255 and/or a height of a top surface of the second barrier pattern 235 may not be equal to a height of the top surface of the second insulating interlayer 210, and a second recess (not shown) may be formed on the second conductive pattern 255 and/or the second barrier pattern 235. Heights of the top surfaces of the second plurality of CNTs 240, which may be substantially equal to the height of the top surface of the second insulating interlayer 210, may be kept. Thus, most of a sidewall of each of the second plurality of CNTs 240 may be covered by the second conductive pattern 255, however, an upper sidewall of each of the second plurality of CNTs 240 may protrude from the upper surface of the second conductive pattern 255.

After forming the second conductive pattern 255, the second substrate 200 may be rotated by 180 degrees so that the second insulating interlayer 210 may be disposed beneath the second substrate 200, and thus the second plurality of CNTs 240 and the second conductive pattern 255 may face downwards.

The first insulating interlayer 110 and second insulating interlayer 210 may be bonded together such that the first conductive pattern 155 and second conductive pattern 255 face each other, and a heat treatment may be performed. In an exemplary embodiment, during the heat treatment, the first conductive pattern 155 and second conductive pattern 255 may thermally expand to remove the first recess 160 and the second recess, and thus the upper surface of the first conductive pattern 155 and the lower surface of the second conductive pattern 255 may contact each other.

In an exemplary embodiment, the top surfaces of the first plurality of CNTs 140 and bottom surfaces of the second plurality of CNTs 240 may contact each other during the bonding process. The first barrier pattern 135 and second barrier pattern 235 may contact each other, however, when misalignment occurs, the first barrier pattern 135 may contact the lower surface of the second insulating interlayer 210, and the second barrier pattern 235 may contact the upper surface of the first insulating interlayer 110.

As illustrated above, when the first insulating interlayer 110 and second insulating interlayer 210 on the respective first substrate 100 and second substrate 200 are bonded with each other and the first conductive pattern 155 and second conductive pattern 255 contained by the respective first insulating interlayer 110 and second insulating interlayer 210 are bonded with each other, the first plurality of CNTs 140 and second plurality of CNTs 240 in the respective first conductive pattern 155 and second conductive pattern 255 may also contact each other. Thus, the adhesion between the first conductive pattern 155 and second conductive pattern 255 may increase, and the contact resistance between the first conductive pattern 155 and second conductive pattern 255 may decrease and the reliability of the electrical connection therebetween may be enhanced.

The figures described above show that one first conductive pattern 155 and one second conductive pattern 255 are formed in the respective first insulating interlayer 110 and second insulating interlayer 210, however, the inventive concept are not limited thereto. Thus, a plurality of conductive patterns may be formed in each of the first insulating interlayer 110 and second insulating interlayer 210.

Figure 6A:
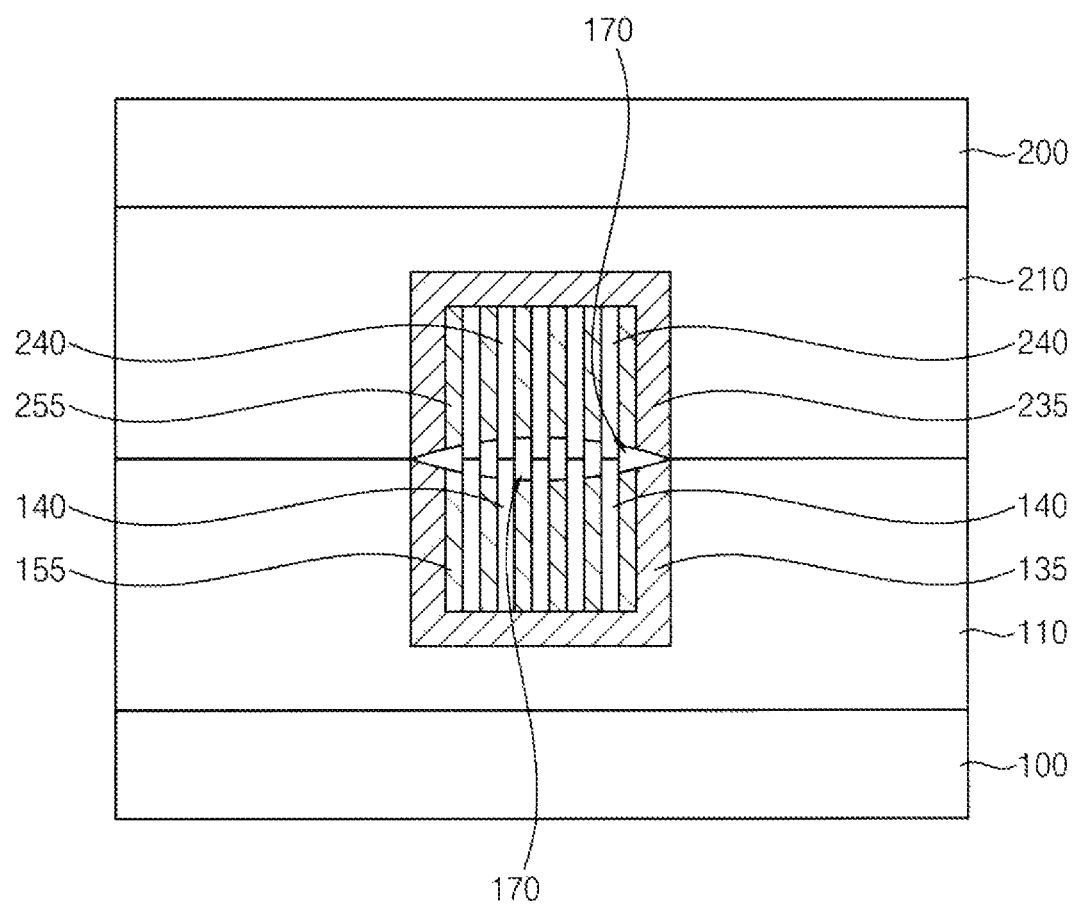

Referring to FIG. 6A, unlike that of FIG. 5, during the heat treatment, the first conductive pattern 155 and second conductive pattern 255 may not sufficiently expand to remove the first recess 160 and the second recess, and thus a first air gap 170 may be formed between the upper surface of the first conductive pattern 155 and the lower surface of the second conductive pattern 255.

However, in an exemplary embodiment, the top surfaces of the first plurality of CNTs 140 may contact the bottom surfaces of the second plurality of CNTs 240, and thus, even if the first air gap 170 is formed between the first conductive pattern 155 and second conductive pattern 255, the first conductive pattern 155 and second conductive pattern 255 may be bonded with each other via the first plurality of CNTs 140 and second plurality of CNTs 240.

The adhesion or the reliability of the electrical connection between the first conductive pattern 155 and second conductive pattern 255 shown in FIG. 6A may be lower than that between the first conductive pattern 155 and second conductive pattern 255 shown in FIG. 5. However, the adhesion or reliability of the electrical connection may be higher than would otherwise be obtained if the first conductive pattern 155 and second conductive pattern 255 had no first and second plurality of CNTs therein.

FIG. 6A shows that the first conductive pattern 155 and second conductive pattern 255 do not contact each other at all, however, the inventive concept may not be limited thereto. Even if the first recess 160 and the second recess may not be completely removed by the thermal expansion of the first conductive pattern 155 and second conductive pattern 255, at least some portions of the first recess 160 and the second recess may be removed so that the first conductive pattern 155 and second conductive pattern 255 may partially contact each other.

Figure 6B:
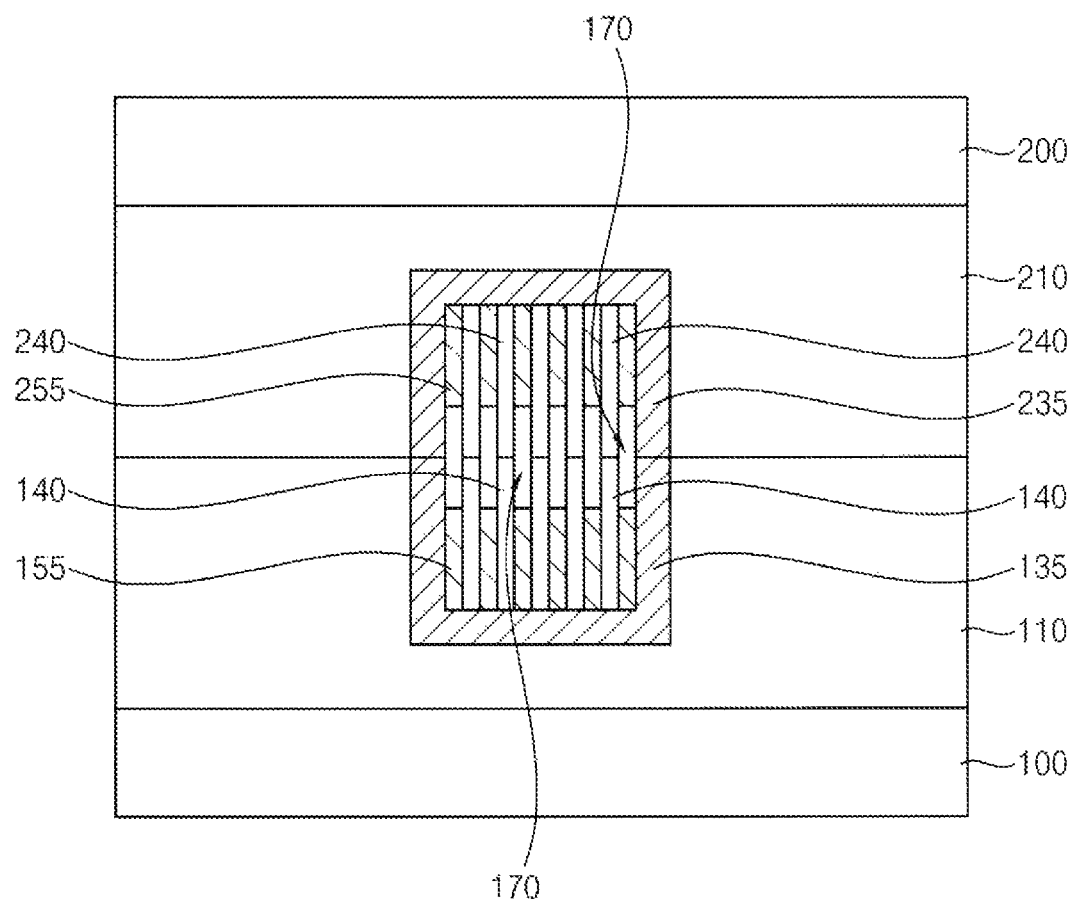
Figure 6C:
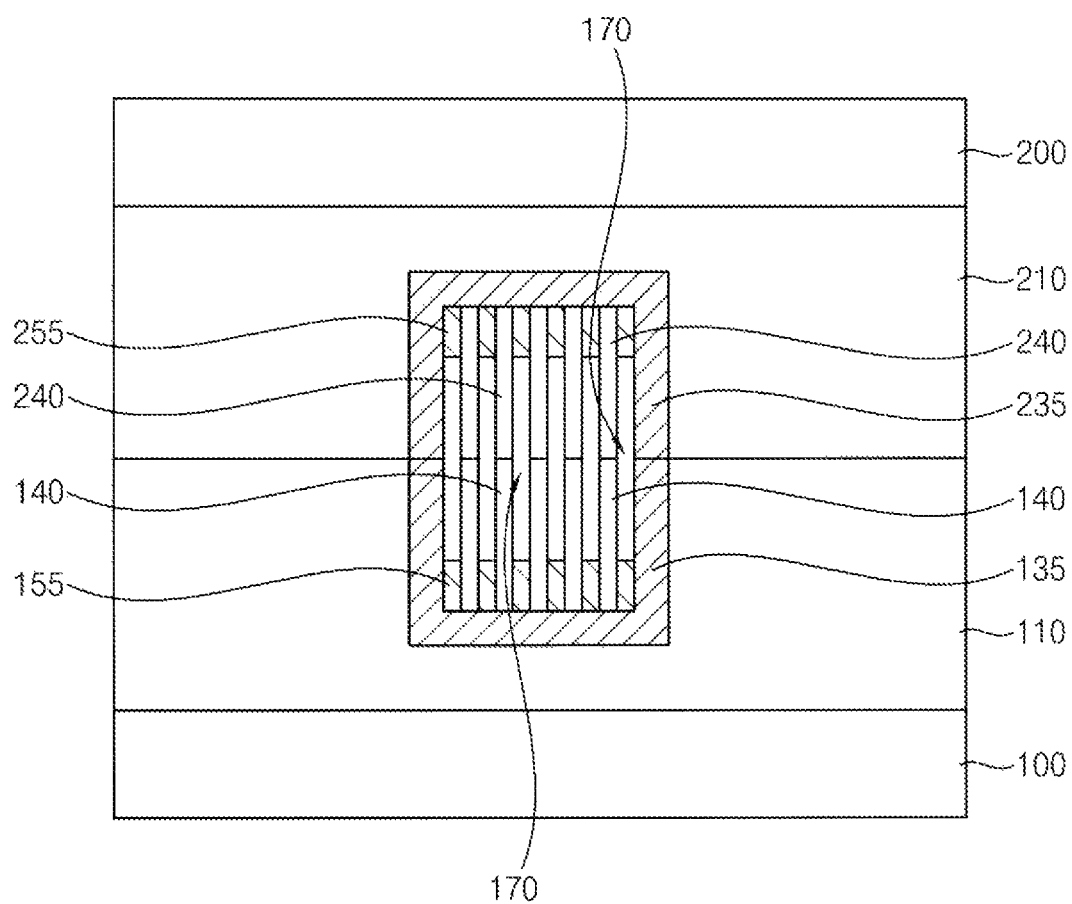

FIGS. 6B and 6C show the first air gaps 170 corresponding to the first recesses 160 shown in FIGS. 4B and 4C.

Figure 7:
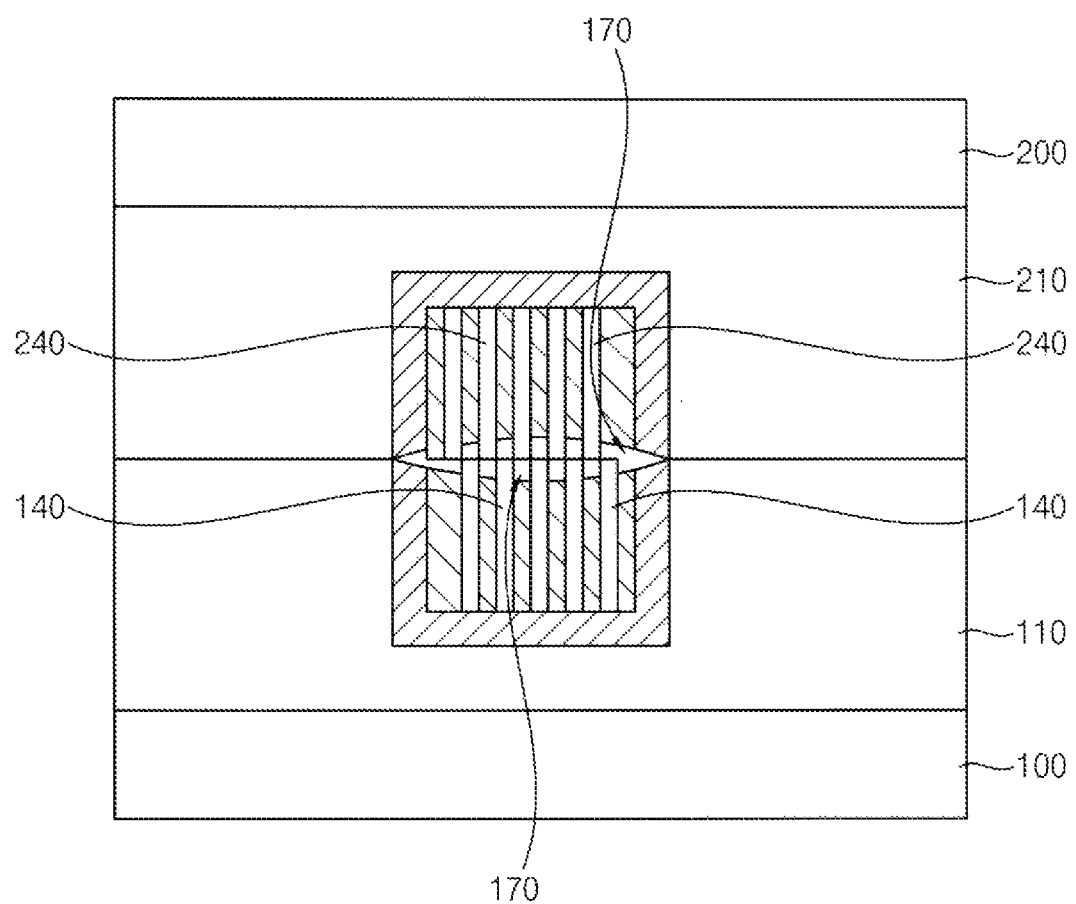

Referring to FIG. 7, similarly to that of FIG. 6, even if the first air gap 170 is formed between the first conductive pattern 155 and second conductive pattern 255, the top surfaces of the first plurality of CNTs 140 may not completely contact the corresponding bottom surfaces of the second plurality of CNTs 240, but the first plurality of CNTs 140 may be disposed between the second plurality of CNTs 240. Even in this case, at least upper edges of the first plurality of CNTs 140 may contact lower edges of the second plurality of CNTs 240, and thus the adhesion or the reliability of the electrical connection between the first conductive pattern 155 and second conductive pattern 255 may increase.

Figure 8:
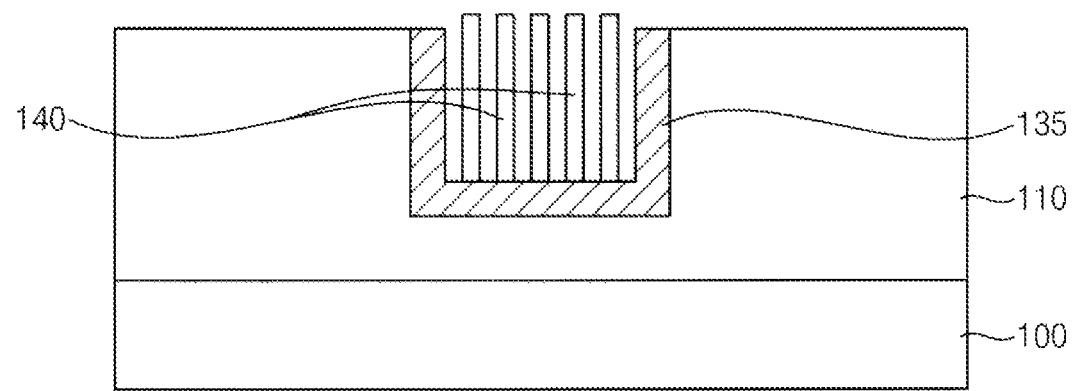
Figure 9:
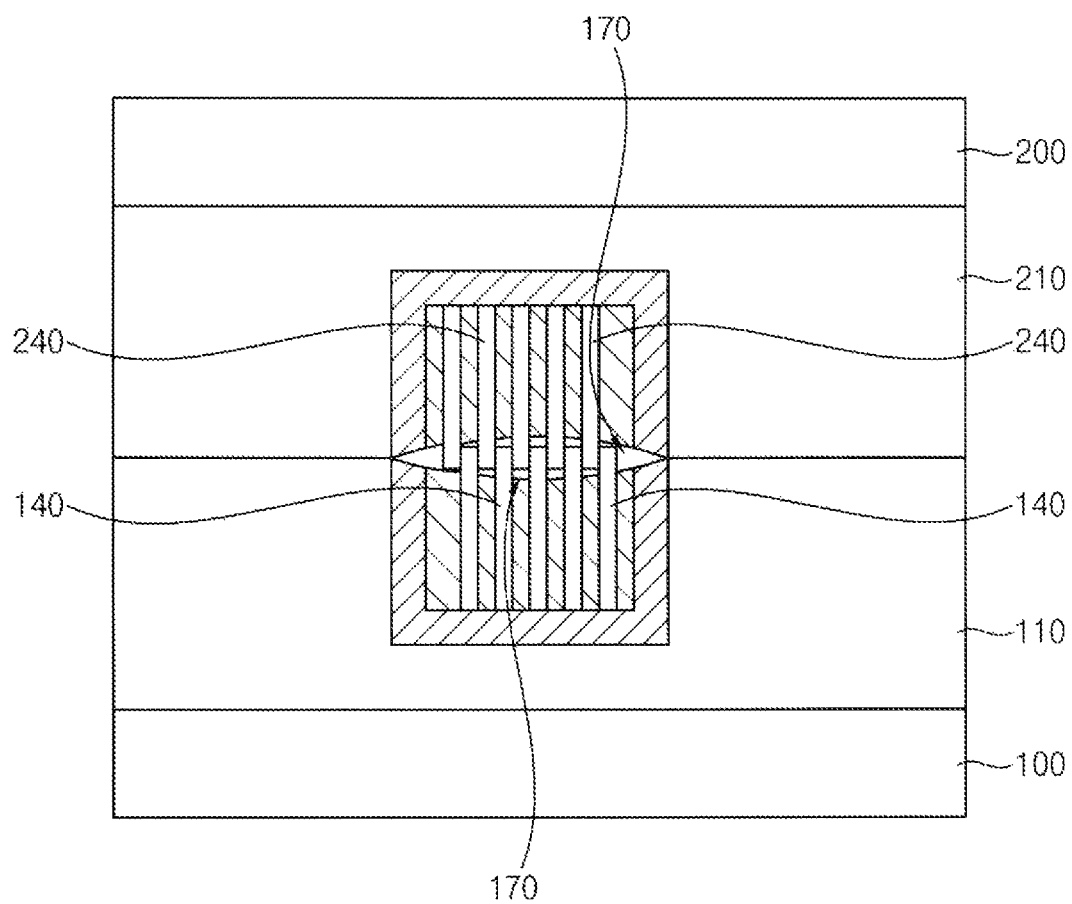

FIGS. 8 to 9 are cross-sectional views illustrating stages of a method of manufacturing a semiconductor device in accordance with an exemplary embodiment. This method may include processes substantially the same as or similar to those illustrated with reference to FIGS. 1 to 7, and thus detailed descriptions thereon are omitted herein.

Referring to FIG. 8, processes substantially the same as or similar to those illustrated with reference to FIGS. 1 and 2 may be performed.

However, heights of the top surfaces of the first plurality of CNTs 140 may be higher than that of the top surface of the first insulating interlayer 110.

Referring to FIG. 9, processes substantially the same as or similar to those illustrated with reference to FIGS. 3, 4 and 7 may be performed.

However, the heights of the top surfaces of the first plurality of CNTs 140 are higher than that of the top surface of the first insulating interlayer 110 and the heights of the top surfaces the second plurality of CNTs 240 are higher than that of the top surface of the second insulating interlayer 210. Thus, when the first insulating interlayer 110 and second insulating interlayer 210 containing the respective first conductive pattern 155 and second conductive pattern 255 are bonded with each other, upper sidewalls of the first plurality of CNTs 140 between the second plurality of CNTs 240 may contact lower sidewalls of the second plurality of CNTs 240. Accordingly, the first plurality of CNTs 140 and second plurality of CNTs 240 may serve as a hook and loop fastener, and the adhesion and the reliability of the electrical connection between the first conductive pattern 155 and second conductive pattern 255 may increase.

FIGS. 10 to 13 are cross-sectional views illustrating stages of a method of manufacturing a semiconductor device in accordance with an exemplary embodiment. This method may include processes substantially the same as or similar to those illustrated with reference to FIGS. 1 to 7 or FIGS. 8 to 9, and thus detailed descriptions thereon are omitted herein.

Figure 10:
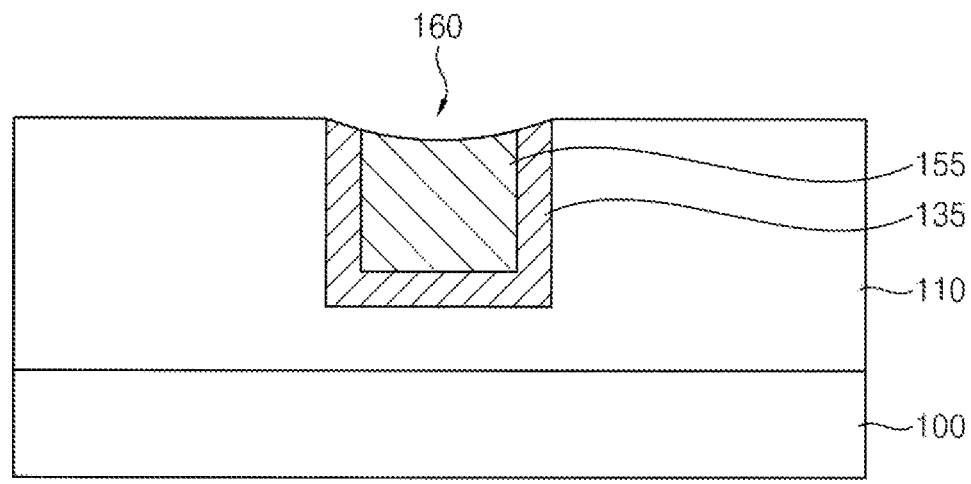

Referring to FIG. 10, processes substantially the same as or similar to those illustrated with reference to FIG. 1 may be performed, and processes substantially the same as or similar to those illustrated with reference to FIGS. 3 and 4 may be performed.

That is, after forming the first barrier pattern 135 on the inner wall of the first trench 120, the first conductive pattern 155 may be formed on the first barrier pattern 135 to fill the first trench 120.

The first recess 160 may be formed on the first conductive pattern 155.

Figure 11:
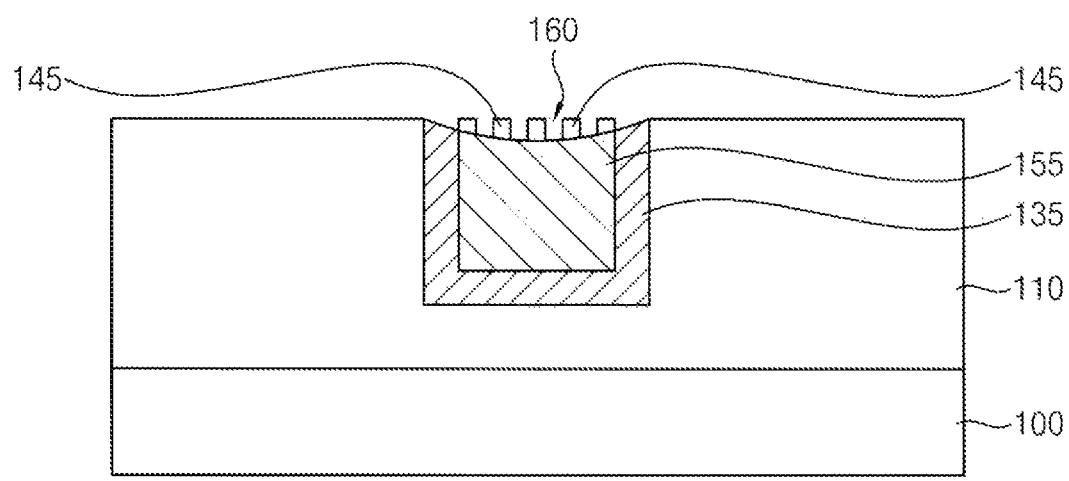

Referring to FIG. 11, processes substantially the same as or similar to those illustrated with reference to FIG. 2 may be performed.

However, a plurality of third CNTs 145 (e.g., conductive CNTs) may be formed on the first conductive pattern 155 in the first recess 160. In an exemplary embodiment, heights of top surfaces of the third plurality of CNTs 145 may be substantially coplanar with the top surface of the first insulating interlayer 110, however, the inventive concept is be limited thereto.

Figure 12A:
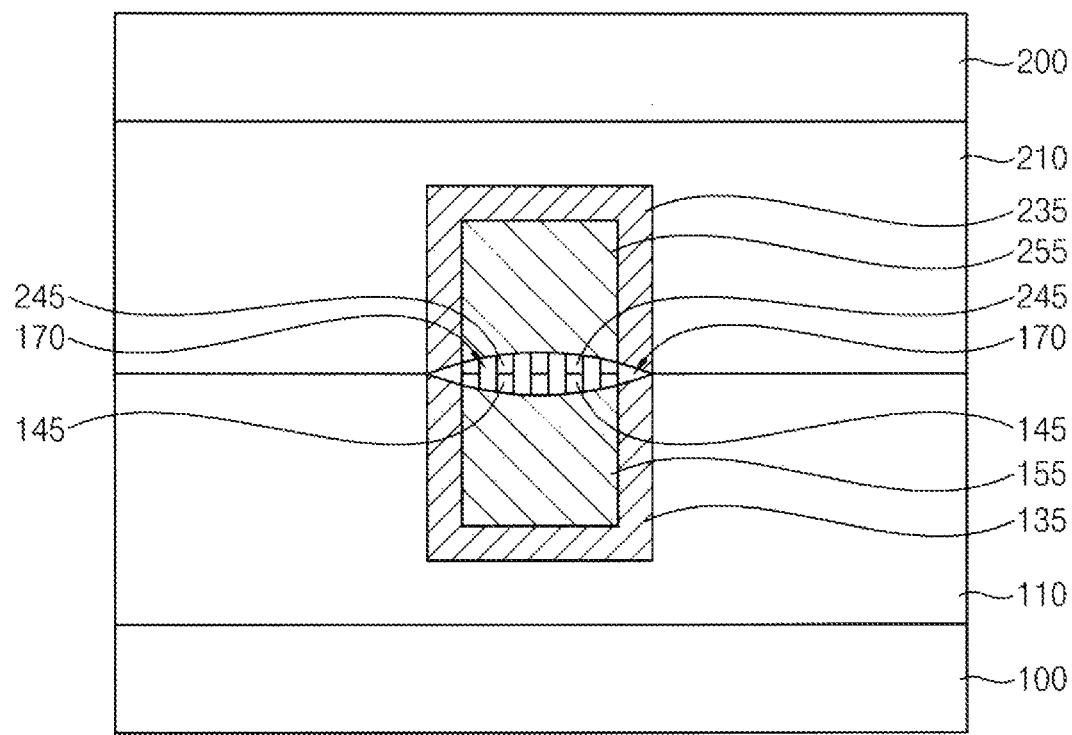

Referring to FIG. 12A, processes substantially the same as or similar to those illustrated with reference to FIG. 6A may be performed.

Thus, when the first insulating interlayer 110 and second insulating interlayer 210 containing the respective first conductive pattern 155 and second conductive pattern 255 are bonded with each other, even if the first air gap 170 is formed between the first conductive pattern 155 and second conductive pattern 255, the top surfaces of the third plurality of CNTs 145 may contact bottom surfaces of fourth plurality of CNTs 245, and thus the adhesion and the reliability of the electrical connection between the first conductive pattern 155 and second conductive pattern 255 may increase.

Figure 12B:
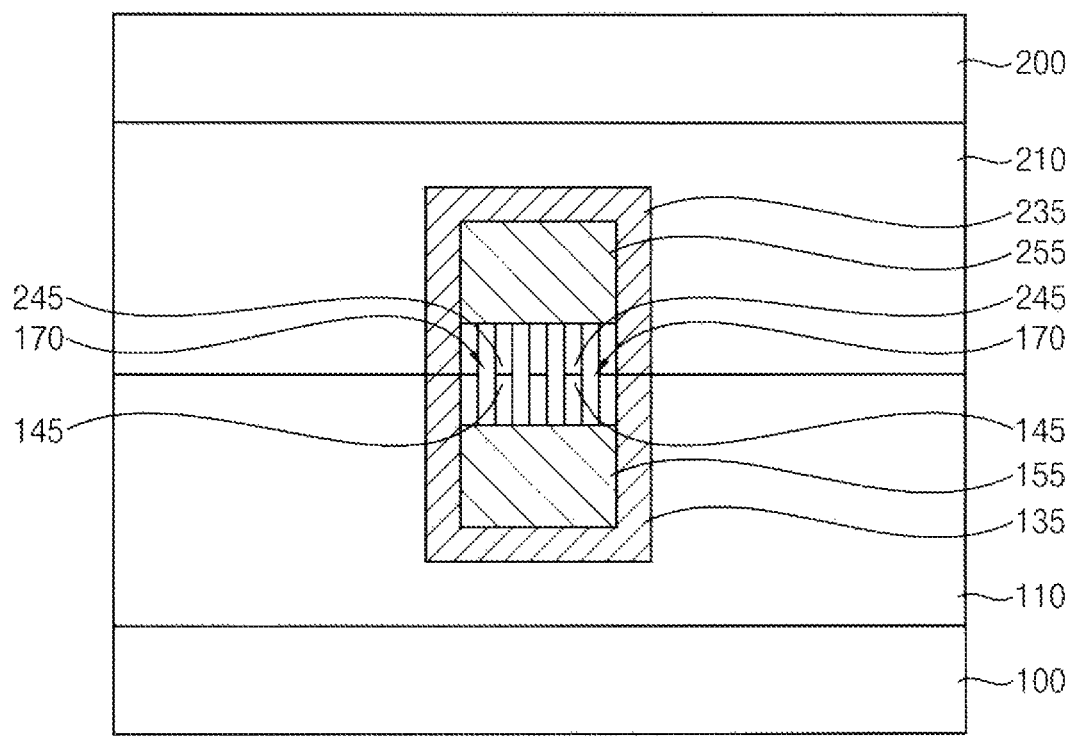
Figure 12C:
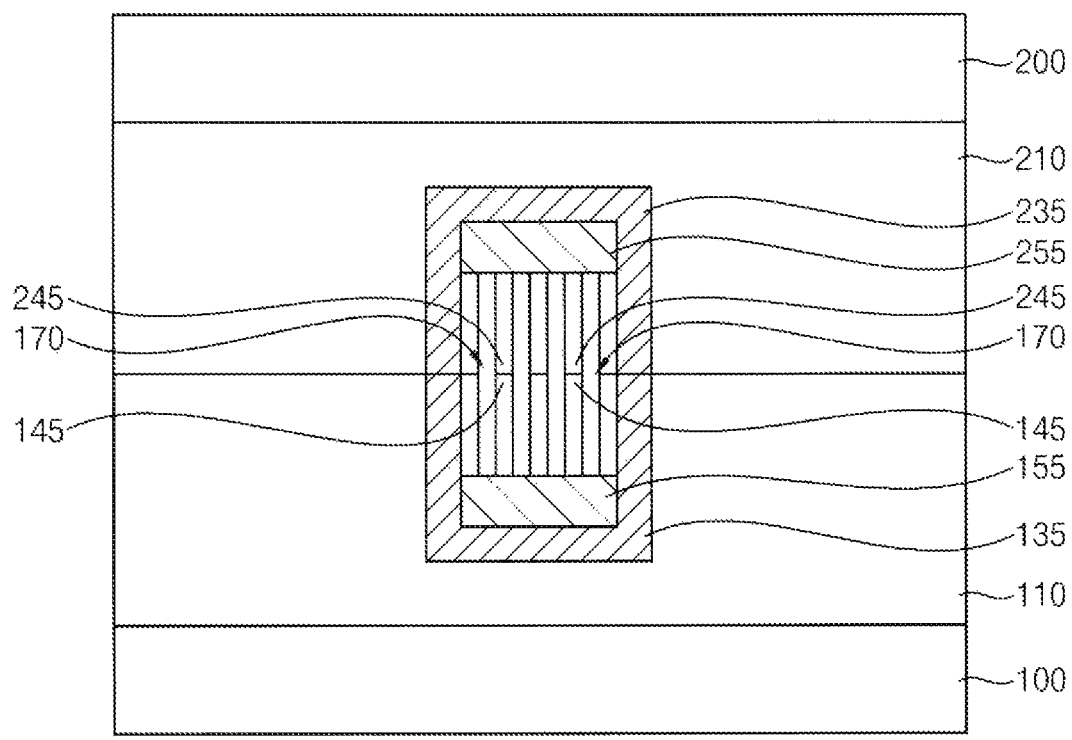

FIGS. 12B and 12C show the cases in which the first recess 160 formed by the processes illustrated with reference to FIG. 11 has the depths of the first recesses 160 illustrated with reference to FIGS. 4B and 4C, respectively.

Figure 13:
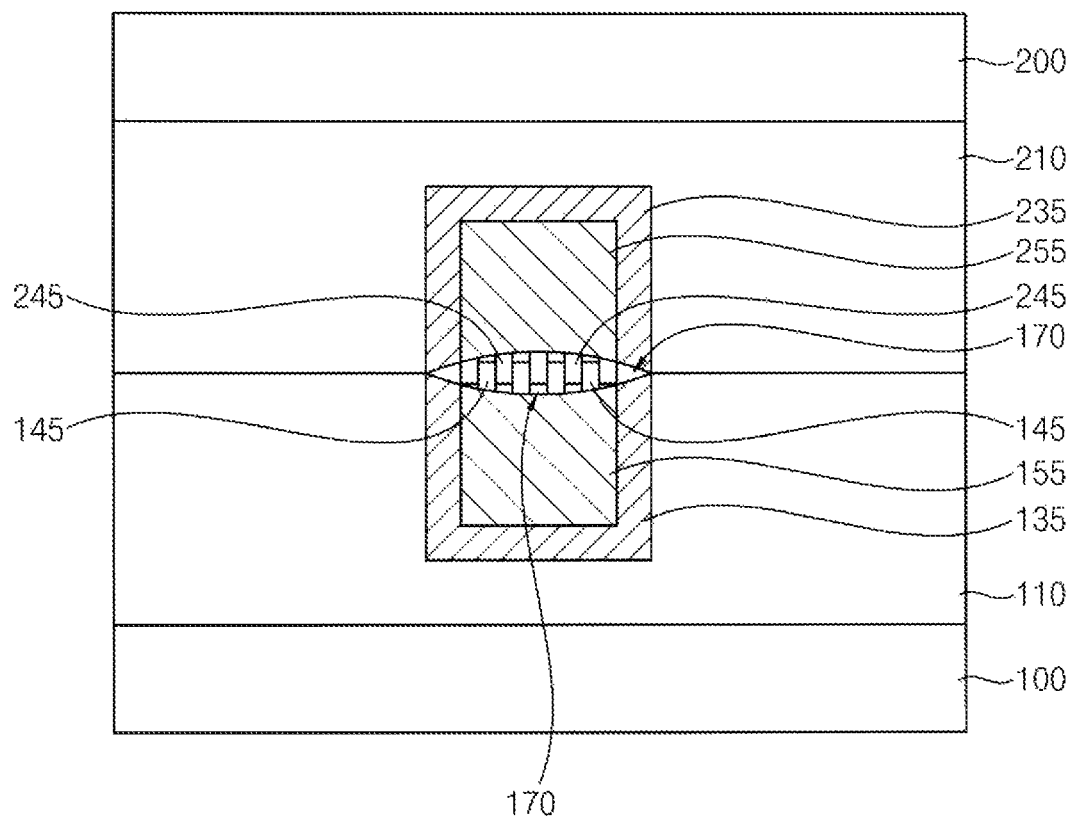

Referring to FIG. 13, similarly to that of FIG. 9, when the first insulating interlayer 110 and second insulating interlayer 210 containing the respective first conductive pattern 155 and second conductive pattern 255 are bonded with each other, the third plurality of CNTs 145 may be disposed between the fourth plurality of CNTs 245, and upper sidewalls of the third plurality of CNTs 145 may contact lower sidewalls of the fourth plurality of CNTs 245.

Similarly to that of FIG. 8, heights of the top surfaces of the third plurality of CNTs 145 may be higher than that of the top surface of the first insulating interlayer 110, and heights of the top surfaces of the fourth plurality of CNTs 245 may be higher than that of the top surface of the second insulating interlayer 210. Thus, when the first insulating interlayer 110 and second insulating interlayer 210 are bonded with each other, the third plurality of CNTs 145 and fourth plurality of CNTs 245 may serve as a hook and loop fastener. Accordingly, the adhesion and the reliability of the electrical connection between the first conductive pattern 155 and second conductive pattern 255 may increase.

Figure 14:
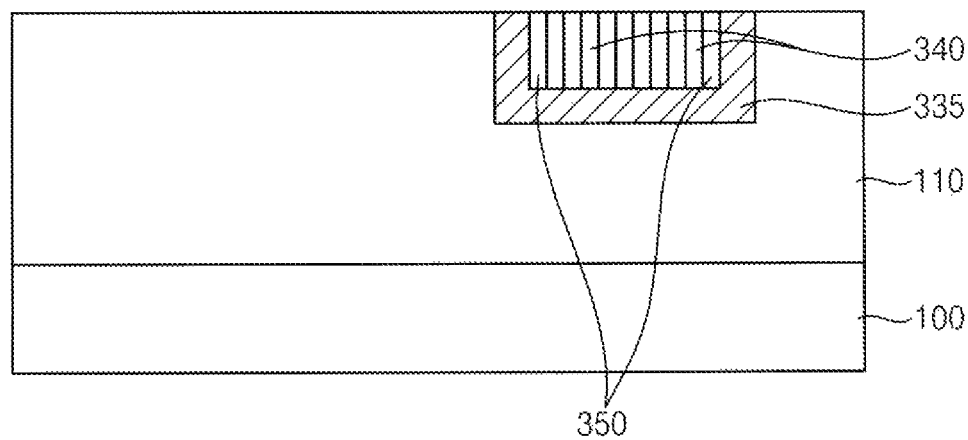
Figure 15:
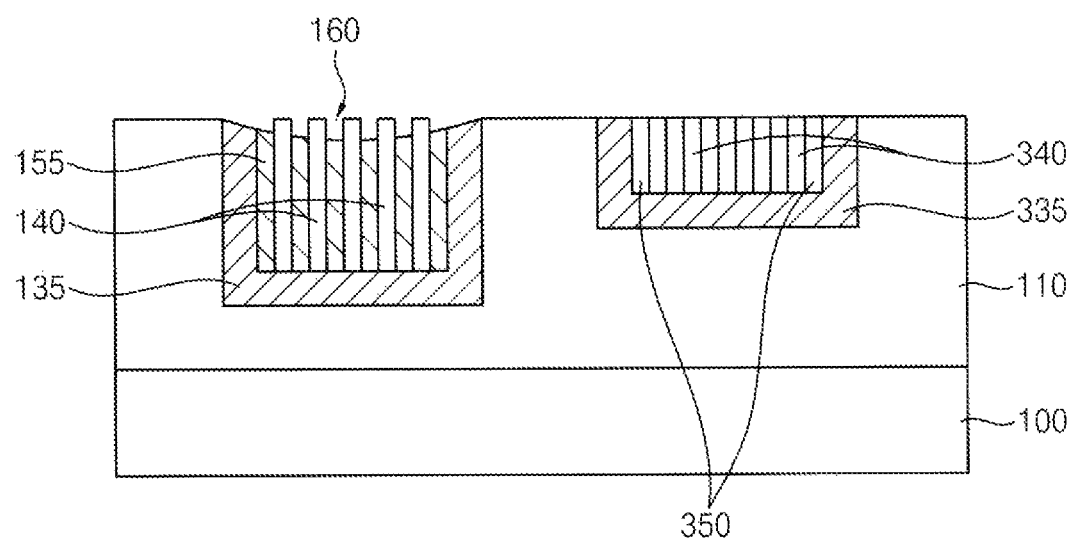
Figure 16:
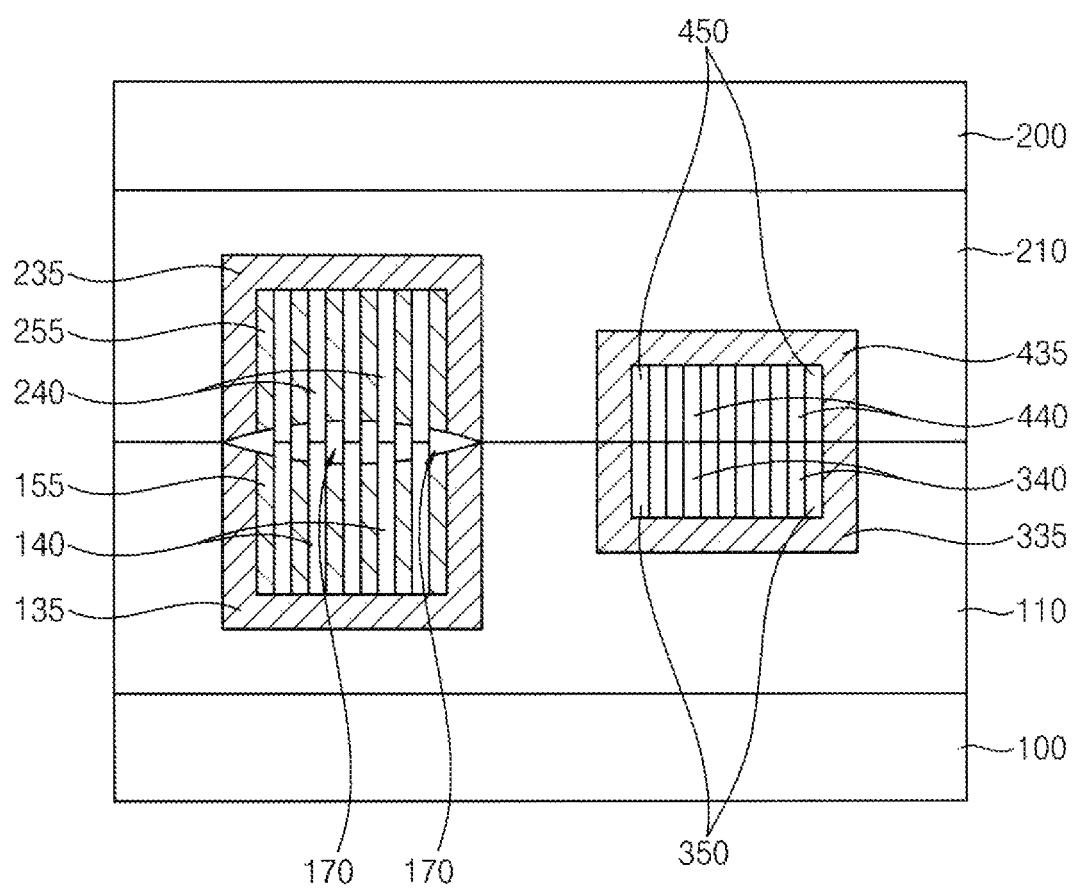

FIGS. 14 to 16 are cross-sectional views illustrating stages of a method of manufacturing a semiconductor device in accordance with an exemplary embodiment. This method may include processes substantially the same as or similar to those illustrated with reference to FIGS. 1 to 7, and thus detailed descriptions thereon are omitted herein.

Referring to FIG. 14, an upper portion of the first insulating interlayer 110 on the first substrate 100 may be removed to form a third trench (not shown), a third barrier pattern 335 may be formed on an inner wall of the third trench, and a plurality of fifth CNTs 340 may be formed on a surface of the third barrier pattern 335 on a bottom of the third trench.

A first insulation layer may be formed on the third barrier pattern 335, the fifth plurality of CNTs 340, and the first insulating interlayer 110 to sufficiently fill a remaining portion of the third trench, and an upper portion of the first insulation layer may be planarized until the top surface of the first insulating interlayer 110 may be exposed to form a first insulation pattern 350 in the third trench.

Referring to FIG. 15, processes substantially the same as or similar to those illustrated with reference to FIGS. 1 to 4 may be performed to form the first barrier pattern 135, the first plurality of CNTs 140, and the first conductive pattern 155 at an upper portion of the first insulating interlayer 110.

Referring to FIG. 16, processes substantially the same as or similar to those illustrated with reference to FIG. 6 may be performed.

Thus, when the first insulating interlayer 110 and second insulating interlayer 210 are bonded with each other, the first conductive pattern 155 and second conductive pattern 255 may be bonded with each other, and the first plurality of CNTs 140 and second plurality of CNTs 240 may be bonded with each other. Additionally, the first insulation pattern 350 and second insulation pattern 450 may be also bonded with each other, and the fifth plurality of CNTs 340 and sixth plurality of CNTs 440 may be also bonded with each other. If misalignment does not occur, the third barrier pattern 335 and fourth barrier pattern 435 may contact to be bonded with each other.

Accordingly, in addition to the bondings between the first conductive pattern 155 and second conductive pattern 255 and between the first plurality of CNTs 140 and second plurality of CNTs 240, the bondings between the first insulation pattern 350 and second insulation pattern 450 and between the fifth plurality of CNTs 340 and sixth plurality of CNTs 440 may be performed, and thus the adhesion between the first insulating interlayer 110 and second insulating interlayer 210 may increase and the reliability of the electrical connection between the first conductive pattern 155 and second conductive pattern 255 may be enhanced.

FIG. 16 shows that the bondings between the first conductive pattern 155 and second conductive pattern 255 and between the first plurality of CNTs 140 and second plurality of CNTs 240 are similar to those of FIG. 6, and the bondings between the first insulation pattern 350 and second insulation pattern 450 and between the fifth plurality of CNTs 340 and sixth plurality of CNTs 440 are similar to those of FIG. 5, however, the inventive concept is not limited thereto, but may be also similar to those illustrated with reference to any of the other figures described herein.

Figure 17:
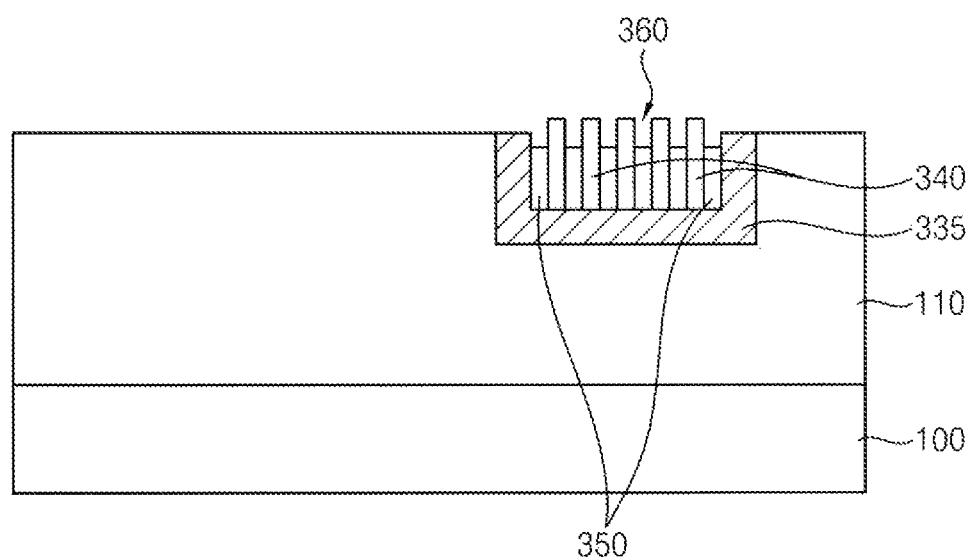
Figure 18:
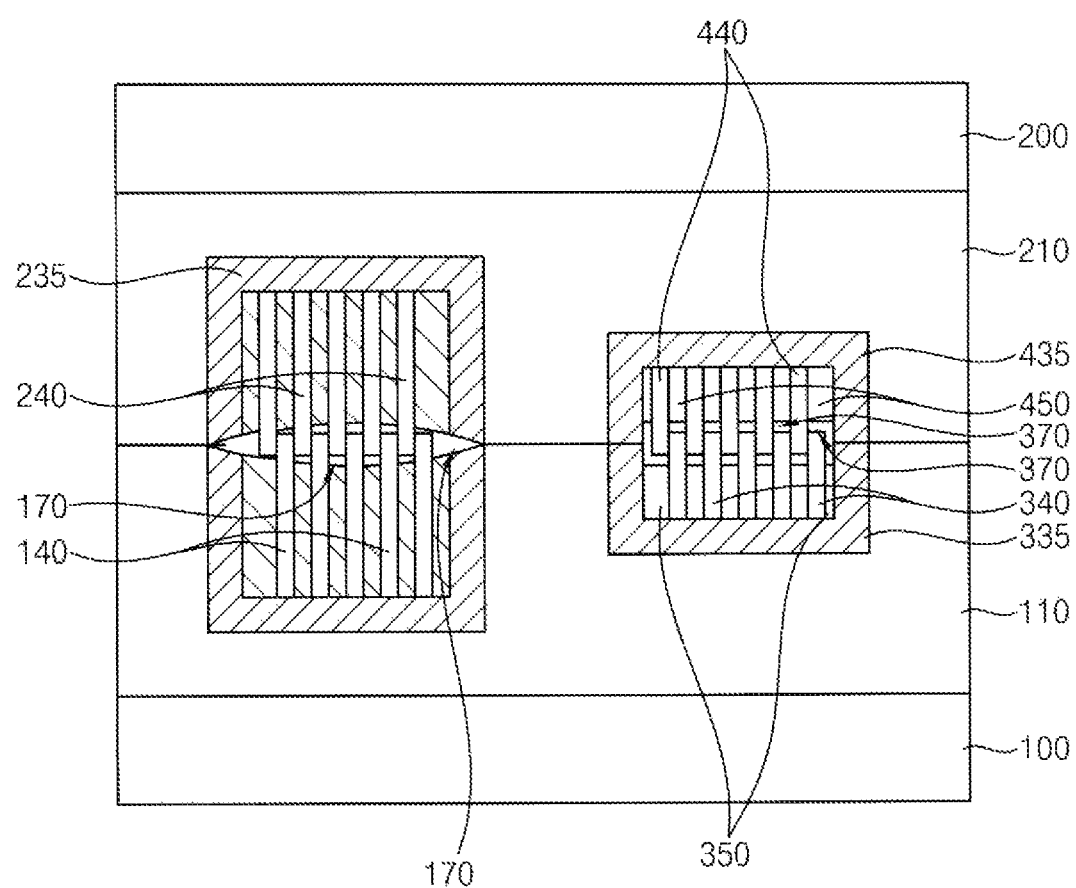

FIGS. 17 to 18 are cross-sectional views illustrating stages of a method of manufacturing a semiconductor device in accordance with an exemplary embodiment. This method may include processes substantially the same as or similar to those illustrated with reference to FIGS. 14 to 16, and thus detailed descriptions thereon are omitted herein.

Referring to FIG. 17, processes substantially the same as or similar to those illustrated with reference to FIG. 14 may be performed.

However, heights of top surfaces of the fifth plurality of CNTs 340 may be higher than that of the top surface of the first insulating interlayer 110, and a height of a top surface of the first insulation pattern 350 may be lower than that of the top surface of the first insulating interlayer 110. When a CMP process for forming the first insulation pattern 350 is performed, a third recess 360 may be formed on the first insulation pattern 350, and upper sidewalls of the fifth plurality of CNTs 340 may protrude from the top surface of the first insulation pattern 350.

Referring to FIG. 18, processes substantially the same as or similar to those illustrated with reference to FIGS. 15 and 16 may be performed.

However, the bondings between the first conductive pattern 155 and second conductive pattern 255 and between the first plurality of CNTs 140 and second plurality of CNTs 240 may be substantially the same as or similar to those illustrated with reference to FIG. 9, and the bondings between the first insulation pattern 350 and second insulation pattern 450 and between the fifth plurality of CNTs 340 and sixth plurality of CNTs 440 may be also substantially the same as or similar to those illustrated with reference to FIG. 9.

Thus, a second air gap 370 may be formed between the first insulation pattern 350 and second insulation pattern 450, and upper portions of the fifth plurality of CNTs 340 and lower portions of the sixth plurality of CNTs 440 may be exposed by the second air gap 370.

In the methods of manufacturing the semiconductor device illustrated with reference to FIGS. 14 to 16 and FIGS. 17 to 18, one first insulation pattern 350 and one second insulation pattern 450 are formed at upper portions of the first insulating interlayer 110 and second insulating interlayer 210, respectively, however, the inventive concept are not limited thereto, and a plurality of insulation patterns may be formed in each of the first insulating interlayer 110 and second insulating interlayer 210. Particularly, the insulation patterns may be additionally formed at an area where the conductive patterns are formed with a relatively low density, so as to serve as dummy patterns for making the density more uniform during a CMP process.

FIGS. 19 to 22 are cross-sectional views illustrating stages of a method of manufacturing a semiconductor device in accordance with an exemplary embodiment. This method may include processes substantially the same as or similar to those illustrated with reference to previous figures, and thus detailed descriptions thereon are omitted herein.

Figure 19:
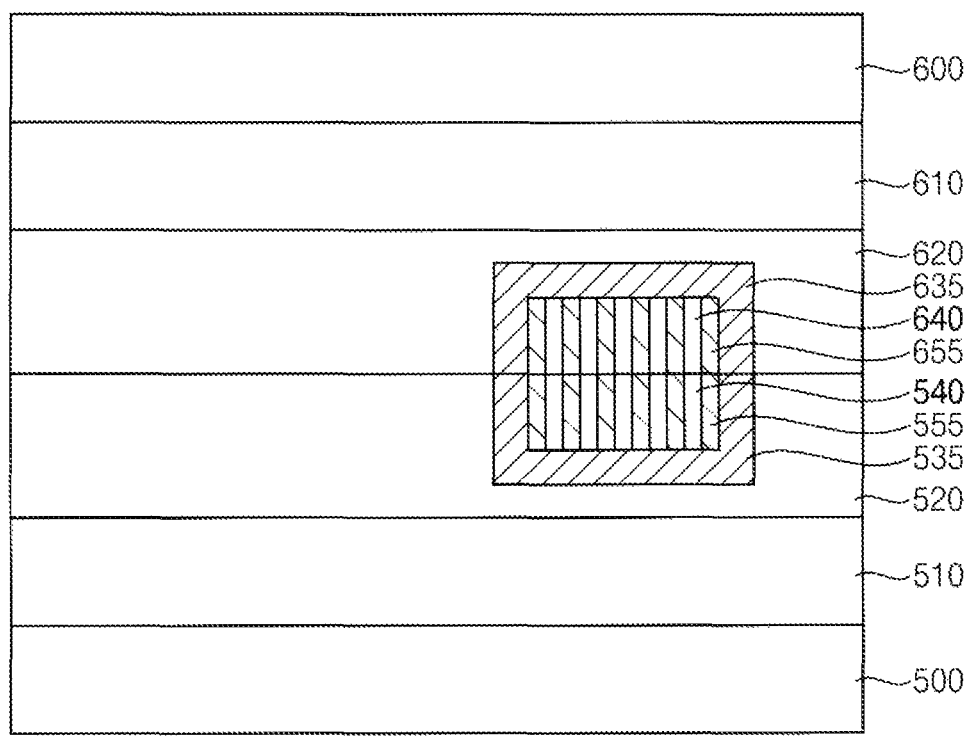

Referring to FIG. 19, third insulating interlayer 510 and fourth insulating interlayers 520 may be sequentially formed on a third substrate 500, and a fifth barrier pattern 535, seventh plurality of CNTs 540, and a third conductive pattern 555 may be formed at an upper portion of the fourth insulating interlayer 520.

A dynamic random access memory (DRAM) device may be formed on the third substrate 500, and various elements of the DRAM device, e.g., gate structures, source/drain layers, bit lines, capacitors, contact plugs, vias, wirings, etc., may be covered by the third insulating interlayer 510.

Various wirings may be further formed in the fourth insulating interlayer 520, and some of the wirings may be electrically connected to the third conductive pattern 555.

In an exemplary embodiment, the fifth barrier pattern 535, the seventh plurality of CNTs 540, and the third conductive pattern 555 may be formed by processes substantially the same as or similar to those illustrated with reference to FIGS. 1 to 4.

Above-mentioned processes may be also performed on the fourth substrate 600, such that fifth insulating interlayer 610 and sixth insulating interlayer 620 may be sequentially formed on the fourth substrate 600, and a sixth barrier pattern 635, eighth plurality of CNTs 640, and a fourth conductive pattern 655 may be formed at an upper portion of the sixth insulating interlayer 620.

A logic device may be formed on the fourth substrate 600, and various elements of the logic device, e.g., gate structures, source/drain layers, bit lines, capacitors, contact plugs, vias, wirings, etc., may be covered by the fifth insulating interlayer 610.

Various wirings may be further formed in the sixth insulating interlayer 620, and some of the wirings may be electrically connected to the fourth conductive pattern 655.

Processes substantially the same as or similar to those illustrated with reference to FIG. 5 may be performed such that the fourth insulating interlayer 520 containing the third conductive pattern 555 and the sixth insulating interlayer 620 containing the fourth conductive pattern 655 may be bonded with each other. The fourth insulating interlayer 520 and sixth insulating interlayer 620 may be also bonded with each other by other processes, e.g., processes substantially the same as or similar to those illustrated with reference to FIG. 6, 7, 9, 12, 13, 16, or 18.

Figure 20:
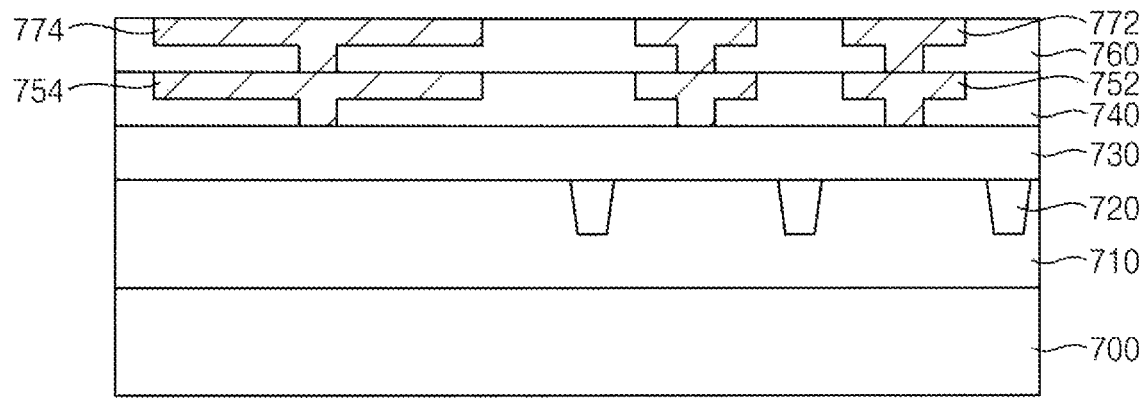

Referring to FIG. 20, a semiconductor layer 710 may be formed on a fifth substrate 700, and a photodiode 720 may be formed at an upper portion of the semiconductor layer 710.

The fifth substrate 700 may include an active pixel region, a peripheral region, and an input/output (I/O) region, and the fifth substrate 700 may be doped with, for example, p-type impurities. In an exemplary embodiment, the semiconductor layer 710 may be formed by an epitaxial growth process on the fifth substrate 700, and the semiconductor layer 710 may be doped with, for example, p-type impurities by a doping concentration lower than that of the fifth substrate 700.

A gate electrode (not shown) may be formed on the semiconductor layer 710, and impurity regions may be further formed at both sides of the gate electrode to form a transistor (not shown). A transfer transistor, a reset transistor, a convert transistor, and a select transistor that may form a unit pixel may be formed on the active pixel region of the fifth substrate 700, and transistors for circuits may be formed on the peripheral region of the fifth substrate 700.

The photodiode 720 may be formed by doping impurities into the semiconductor layer 710, and a plurality of photodiodes 720 may be formed at portions of the semiconductor layer 710 on the active pixel region of the fifth substrate 700.

Seventh insulating interlayer 730, eighth insulating interlayer 740, and ninth insulating interlayer 760 may be sequentially formed on the semiconductor layer 710 and the photodiodes 720, and first wiring 752, second wiring 754, third wiring 772, and fourth wiring 774 may be formed in one or more of the seventh insulating interlayer 730, eighth insulating interlayer 740, or ninth insulating interlayer 760. In an exemplary embodiment, the first wiring 752 and third wiring 772 may be formed on the active pixel region of the fifth substrate 700, and the second wiring 754 and fourth wiring 774 may be formed on the I/O region of the fifth substrate 700.

The first wiring 752, second wiring 754, third wiring 772, and fourth wirings 774 may include a metal, e.g., copper, platinum, tungsten, aluminum, etc., and may be formed, for example, by a damascene process.

Figure 21:
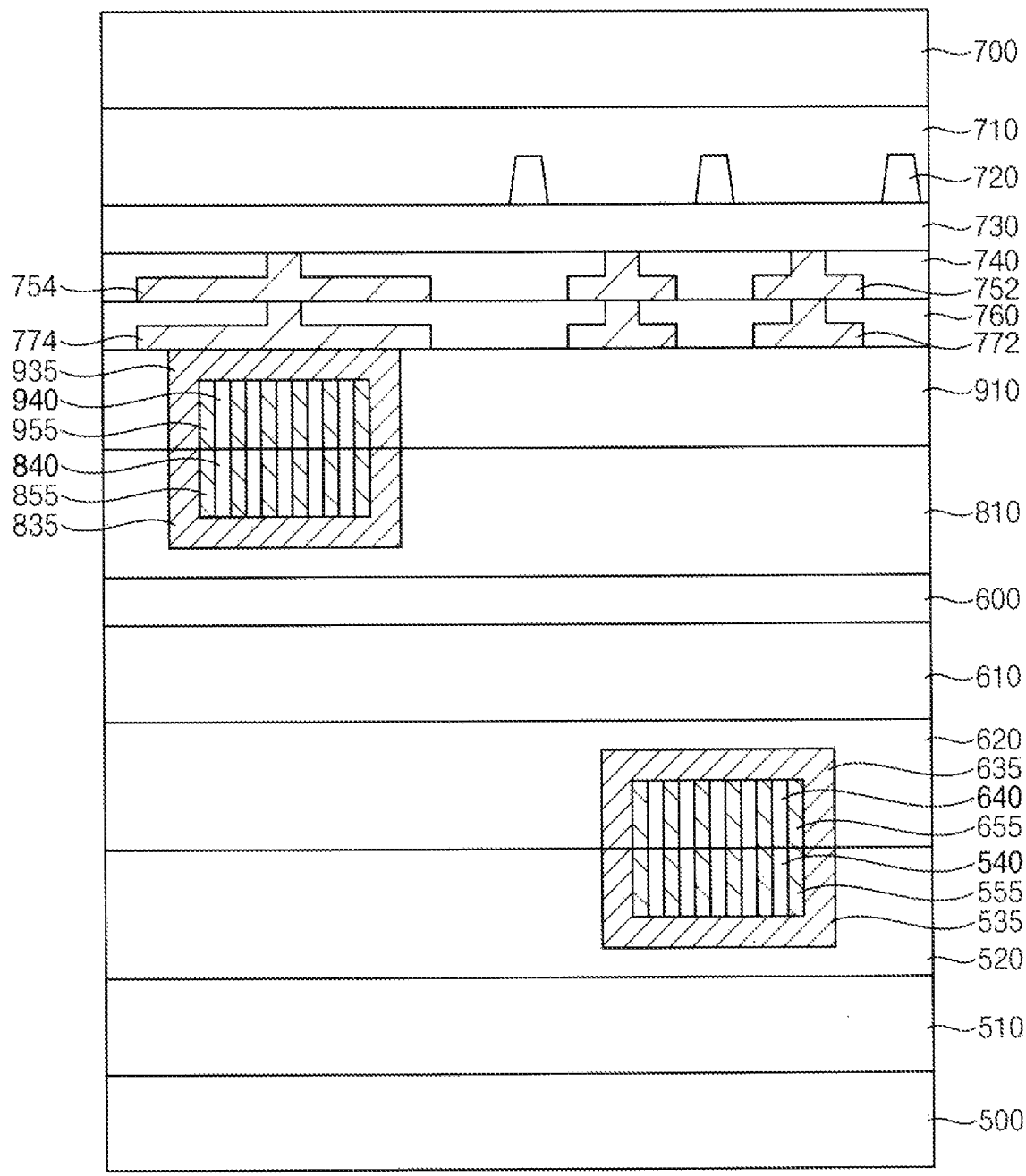

Referring to FIG. 21, after removing an upper portion of the fourth substrate 600, a tenth insulating interlayer 810 may be formed on the fourth substrate 600, and a seventh barrier pattern 835, ninth plurality of CNTs 840, and a fifth conductive pattern 855 may be formed at an upper portion of the tenth insulating interlayer 810.

In an exemplary embodiment, the upper portion of the fourth substrate 600 may be removed by a grinding process.

Additionally, an eleventh insulating interlayer 910 may be formed on the ninth insulating interlayer 760 and the third wiring 772 and fourth wiring 774 on the fifth substrate 700, an eighth barrier pattern 935, tenth plurality of CNTs 940, and a sixth conductive pattern 955 may be formed at an upper portion of the eleventh insulating interlayer 910, and the fifth substrate 700 may be rotated by 180 degrees so that the tenth insulating interlayer 810 and eleventh insulating interlayer 910 may be bonded with each other. The fifth conductive pattern 855 and sixth conductive pattern 955 and the ninth plurality of CNTs 840 and tenth plurality of CNTs 940 may be bonded by processes substantially the same as or similar to those illustrated with reference to FIG. 5, FIG. 6, etc.

Figure 22:
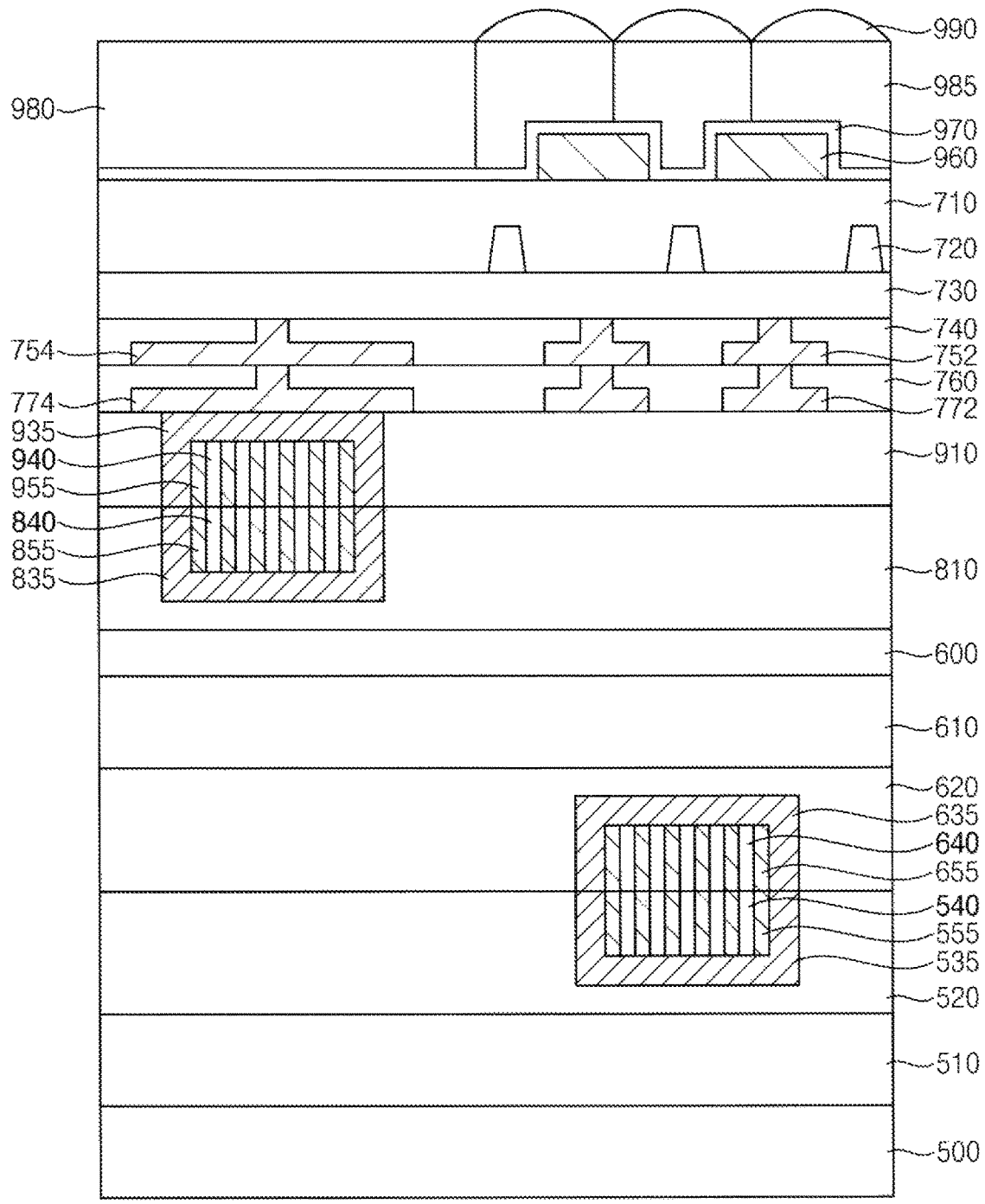

Referring to FIG. 22, after removing the fifth substrate 700 to expose an upper surface of the semiconductor layer 710, a grid structure 960 may be formed on the exposed upper surface of the semiconductor layer 710.

In an exemplary embodiment, the grid structure 960 may be formed not to vertically overlap the photodiodes 720 in the active pixel region, and unit pixels may be defined by the grid structure 960. The grid structure 960 may include a metal, e.g., tungsten, aluminum, etc.

When the grid structure 960 is formed in the active pixel region, a blocking layer (not shown) for blocking incident lights may be formed in the peripheral region, and contact plugs (not shown) and pads (not shown) some of which may be electrically connected to the second wiring 754 may be formed in the I/O region.

A protection layer 970 may be conformally formed on the grid structure 960 and the semiconductor layer 710, a color filter layer 980 may be formed on the protection layer 970, and color filters 985 may be formed in the color filter layer 980 in the active pixel region. The color filter layer 980 may include, e.g., an organic layer or a photoresist layer. The color filters 985 may be formed by patterning the color filter layer 980, and red light, green light, and blue light may penetrate through the color filters 985, respectively.

A micro lens 990 may be formed on each of the color filters 985 so that the semiconductor device may be fabricated.

The semiconductor device may include a DRAM device, a logic device, and a complementary metal oxide semiconductor (CMOS) image sensor sequentially stacked, which may be bonded with each other by the fourth insulating interlayer 520, sixth insulating interlayer 620, tenth insulating interlayer 810, and eleventh insulating interlayer 910 containing the third conductive pattern 555, fourth conductive pattern 655, fifth conductive pattern 855, and sixth conductive pattern 955, respectively, and the adhesion and the reliability of the electrical connection therebetween may increase due to the seventh plurality of CNTs 540, eighth plurality of CNTs 640, ninth plurality of CNTs 840, and tenth plurality of CNTs 940.

Figure 23:
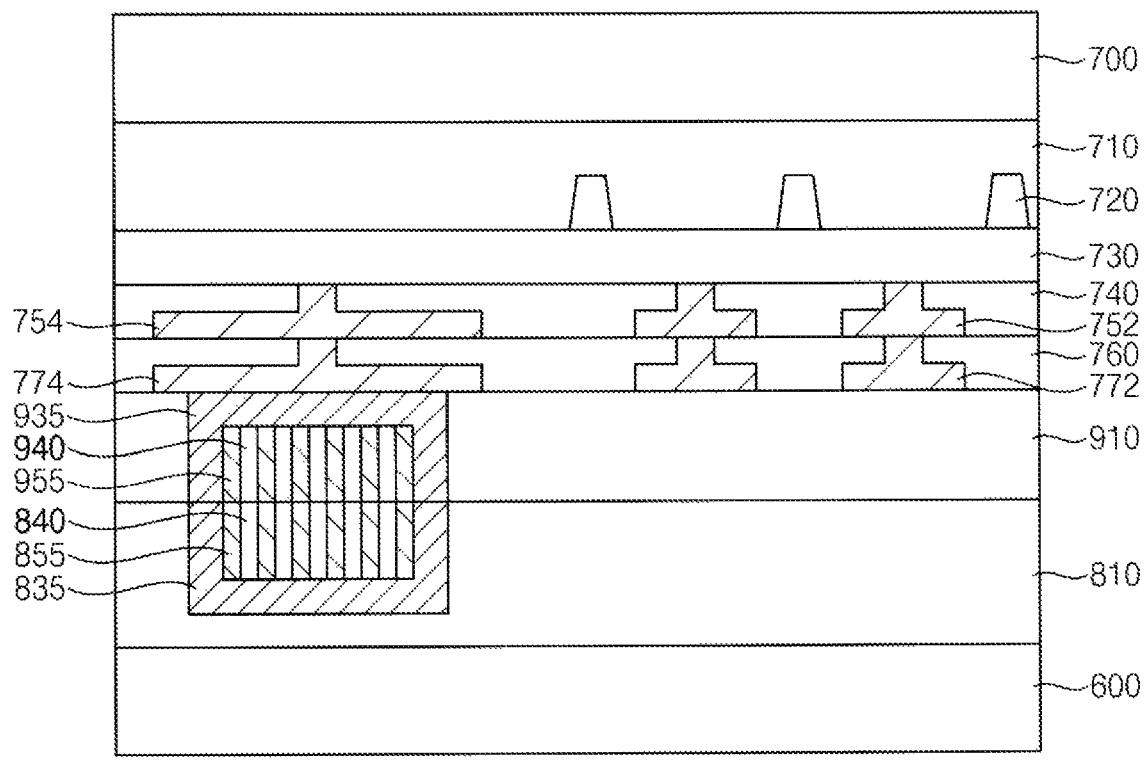
Figure 24:
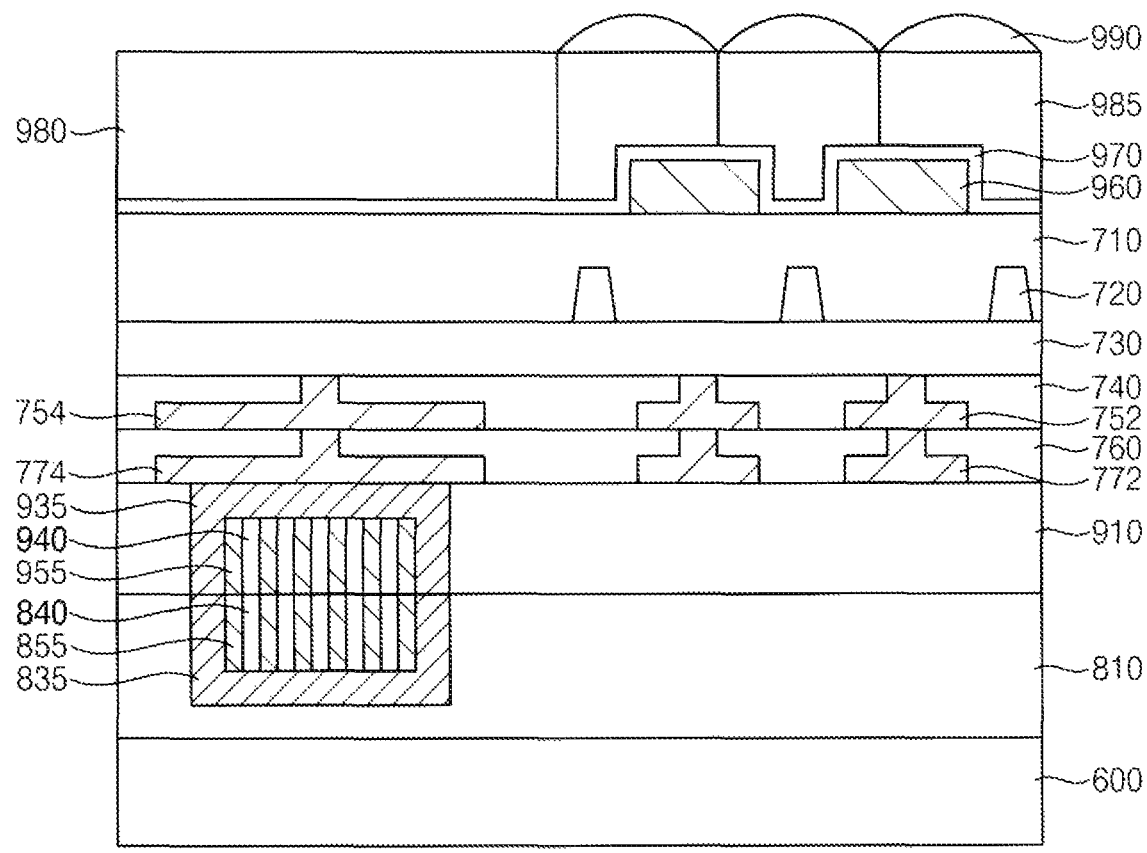
Figure 25:
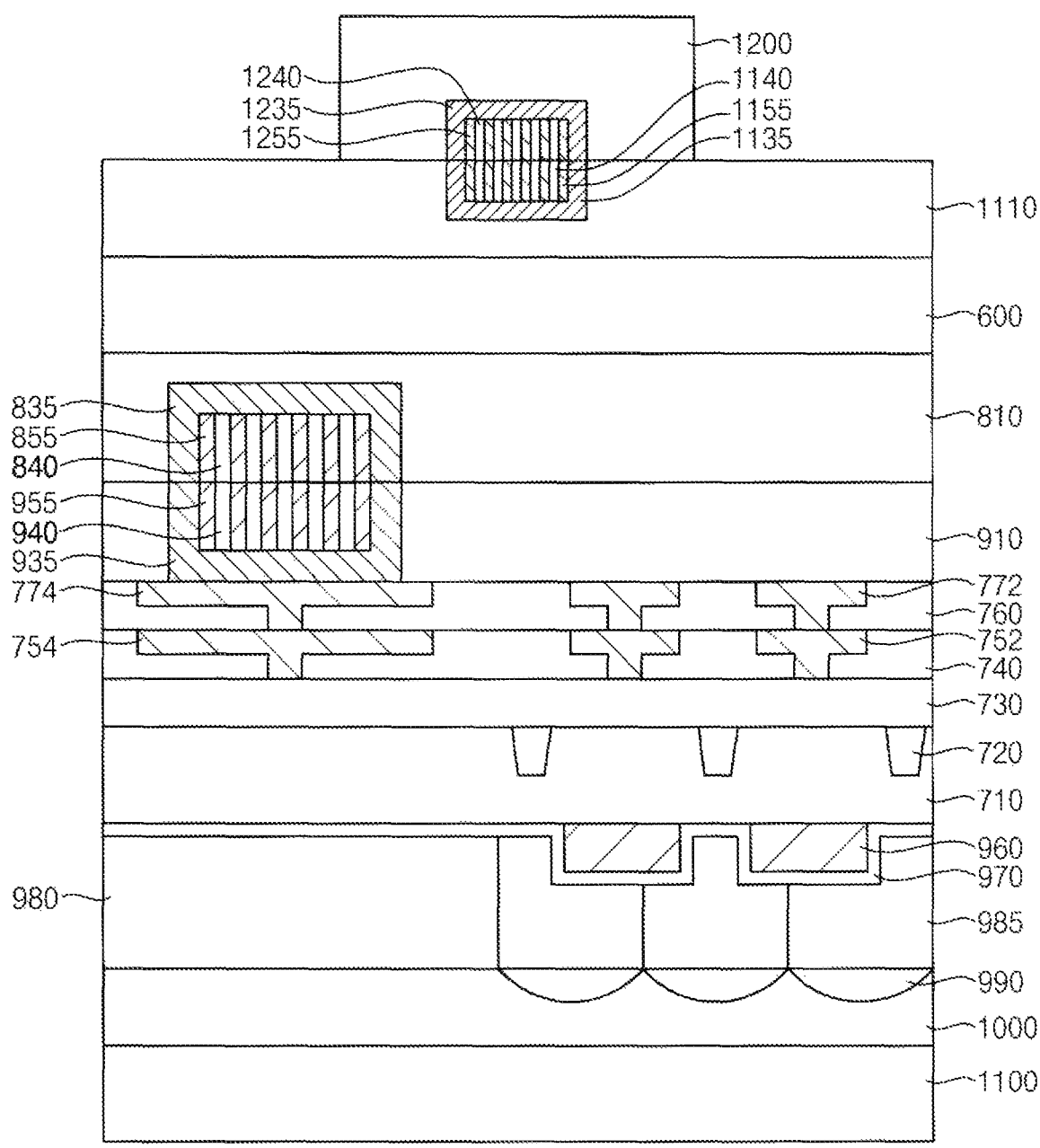

FIGS. 23 to 25 are cross-sectional views illustrating stages of a method of manufacturing a semiconductor device in accordance with an exemplary embodiment. This method may include processes substantially the same as or similar to those illustrated with reference to FIGS. 19 to 22, and thus detailed descriptions thereon are omitted herein.

Referring to FIG. 23, processes substantially the same as or similar to those illustrated with reference to FIGS. 19 to 21 may be performed.

However, the processes for forming the DRAM device, e.g., sequentially forming the third insulating interlayer 510 and fourth insulating interlayer 520 on the third substrate 500, and forming the fifth barrier pattern 535, the seventh plurality of CNTs 540, and the third conductive pattern 555 at an upper portion of the fourth insulating interlayer 520 may not be performed.

Thus, the fifth conductive pattern 855 and the ninth plurality of CNTs 840 at an upper portion of the tenth insulating interlayer 810 on the fourth substrate 600 may be bonded with the sixth conductive pattern 955 and the tenth plurality of CNTs 940, respectively, at an upper portion of the eleventh insulating interlayer 910 on the fifth substrate 700.

Unlike those of FIG. 21, the partial removal of the fourth substrate 600 may not be performed.

Referring to FIG. 24, processes substantially the same as or similar to those illustrated with reference to FIG. 22 may be performed such that the fifth substrate 700 is removed, and the grid structure 960, the protection layer 970, the color filter layer 980, the color filters 985, and the micro lens 990 are formed.

Referring to FIG. 25, a transparent adhesive 1000 may be bonded to an upper surface of the color filter layer 980 having the micro lens 990 thereon, a handling substrate 1100 may be formed on the transparent adhesive 1000, and the whole structure may be rotated by 180 degrees using the handling substrate 1100.

Various wirings and a twelfth insulating interlayer 1110 covering the wirings may be formed on the fourth substrate 600, and a chip 1200 including a DRAM device may be formed on the twelfth insulating interlayer 1110.

A ninth barrier pattern 1135, eleventh plurality of CNTs 1140, and a seventh conductive pattern 1155 may be formed at an upper portion of the twelfth insulating interlayer 1110 to be electrically connected to some of the wirings, and the chip 1200 may include a tenth barrier pattern 1235, twelfth plurality of CNTs 1240, and an eighth conductive pattern 1255 at a lower portion thereof. Thus, the seventh conductive pattern 1155 and eighth conductive pattern 1255 may be bonded with each other, and the eleventh plurality of CNTs 1140 and twelfth plurality of CNTs 1240 may be bonded with each other.

This semiconductor device may include a contact image sensor (CIS), a logic device, and a DRAM device sequentially stacked as the semiconductor device fabricated by the method illustrated with reference to FIGS. 19 to 22, and the adhesion and the reliability of the electrical connection among the CIS, the logic device, and the DRAM device may increase by the ninth plurality of CNTs 840, tenth plurality of CNTs 940, eleventh plurality of CNTs 1140 and twelfth plurality of CNTs 1240.

Figure 26:
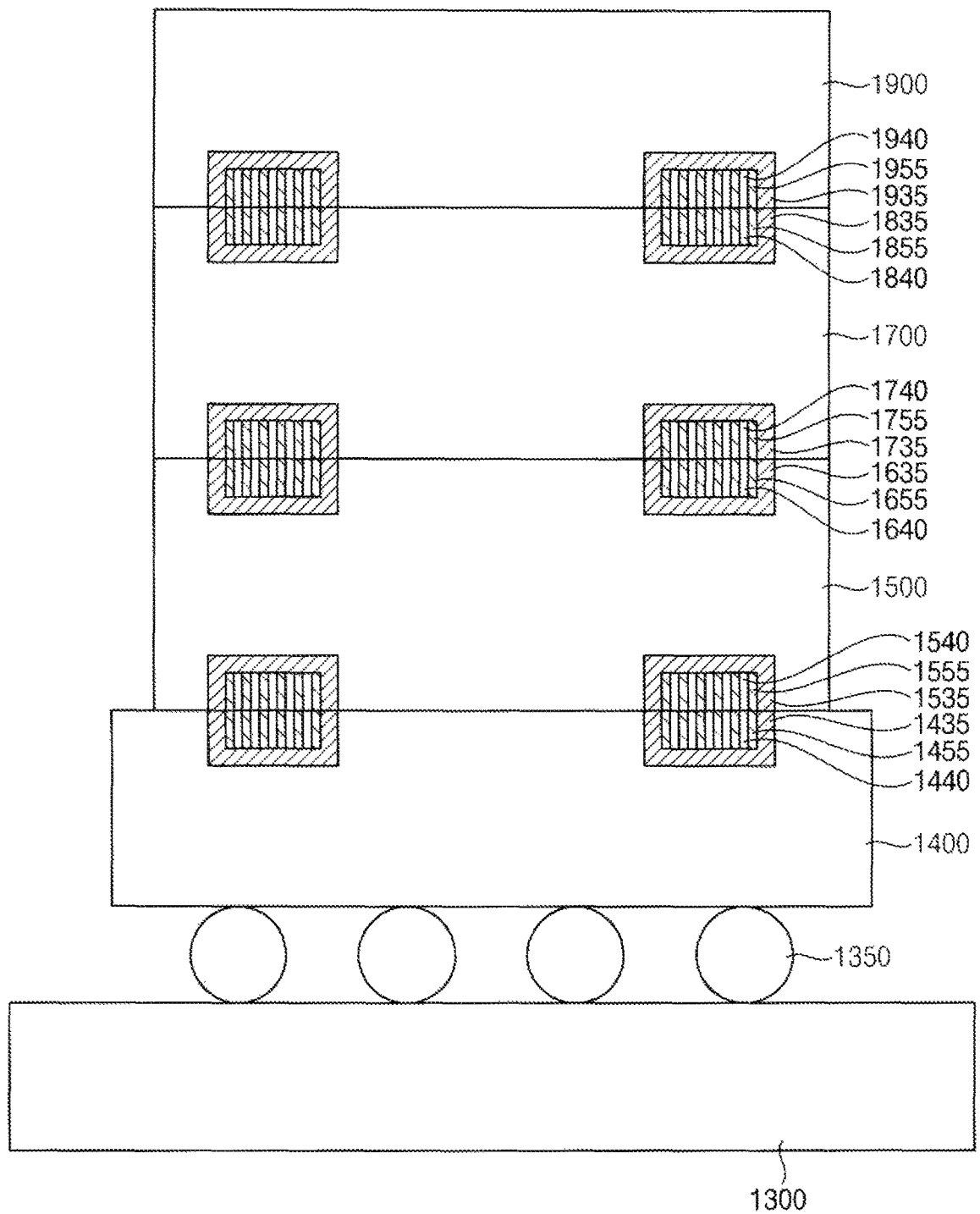

FIG. 26 is a cross-sectional view illustrating a semiconductor device in accordance with an exemplary embodiment. This semiconductor device may include elements substantially the same as or similar to those previously illustrated, and thus detailed descriptions thereon are omitted herein.

Referring to FIG. 26, the semiconductor device may include a logic die 1400, and first DRAM die 1500, second DRAM die 1700, and third DRAM die 1900 sequentially stacked on a package substrate 1300.

The package substrate 1300 and the logic die 1400 may be electrically connected with each other by a bump 1350 disposed therebetween. An interposer (not shown) may be further disposed between the package substrate 1300 and the logic die 1400 so that the electrical connection between the package substrate 1300 and the logic die 1400 may be easier.

The logic die 1400 and the first DRAM die 1500, or the first DRAM die 1500, second DRAM die 1700, and third DRAM die 1900 may be bonded with each other by the methods illustrated with reference to FIGS. 1 to 18.

Particularly, an eleventh barrier pattern 1435, a thirteenth plurality of CNTs 1440, and a ninth conductive pattern 1455 may be formed at an upper portion of the logic die 1400, and a twelfth barrier pattern 1535, a fourteenth plurality of CNTs 1540, and a tenth conductive pattern 1555 may be formed at a lower portion of the first DRAM die 1500. The ninth conductive pattern 1455 and tenth conductive pattern 1555 may be bonded with each other, and the thirteenth plurality of CNTs 1440 and fourteenth plurality of CNTs 1540 may be bonded with each other.

Additionally, a thirteenth barrier pattern 1635, fifteenth plurality of CNTs 1640, and an eleventh conductive pattern 1655 may be formed at an upper portion of the first DRAM die 1500, and a fourteenth barrier pattern 1735, sixteenth plurality of CNTs 1740, and a twelfth conductive pattern 1755 may be formed at a lower portion of the second DRAM die 1700. The eleventh conductive pattern 1655 and twelfth conductive pattern 1755 may be bonded with each other, and the fifteenth plurality of CNTs 1640 and sixteenth plurality of CNTs 1740 may be bonded with each other.

Additionally, a fifteenth barrier pattern 1835, seventeenth plurality of CNTs 1840, and a thirteenth conductive pattern 1855 may be formed at an upper portion of the second DRAM die 1700, and a sixteenth barrier pattern 1935, an eighteenth plurality of CNTs 1940, and a fourteenth conductive pattern 1955 may be formed at a lower portion of the third DRAM die 1900. The thirteenth conductive pattern 1855 and fourteenth conductive pattern 1955 may be bonded with each other, and the seventeenth plurality of CNTs 1840 and eighteenth plurality of CNTs 1940 may be bonded with each other.

FIG. 26 shows that the semiconductor device includes three DRAM dies, a first DRAM die 1500, second DRAM die 1700, and third DRAM die 1900 sequentially stacked, however, the inventive concept may not be limited thereto, and the semiconductor device may include more than three DRAM dies sequentially stacked.

The logic die 1400 and the first DRAM die 1500, or one of the first DRAM die 1500, second DRAM die 1700, and third DRAM die 1900 may not be bonded by the conductive pattern and the CNTs, but may be bonded by, e.g., through a silicon via (TSV) and a bump.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A semiconductor device, comprising:
   a first conductive pattern contained at an upper portion of a first insulating interlayer on a first substrate;
   a first plurality of carbon nanotubes (CNTs) extending in a vertical direction relative to an upper surface of the first substrate, at least a portion of a sidewall of each of the first plurality of CNTs being covered by the first conductive pattern;
   a second conductive pattern contained at a lower portion of a second insulating interlayer beneath a second substrate, a lower surface of the second insulating interlayer contacting an upper surface of the first insulating interlayer; and
   a second plurality of CNTs extending in the vertical direction, at least a portion of a sidewall of each of the second plurality of CNTs being covered by the second conductive pattern,
   wherein the first and second conductive patterns face each other in the vertical direction, wherein the first plurality of CNTs and the second plurality of CNTs are opposite to each other in the vertical direction, and wherein at least one of the first plurality of CNTs and at least one of the second plurality of CNTs contact each other; and
   wherein a top surface of the at least one of the first plurality of CNTs and a bottom surface of the at least one of the second plurality of CNTs contact each other.

2. The semiconductor device of claim 1, wherein top surfaces of the first plurality of CNTs are substantially coplanar with a top surface of the first insulating interlayer, and bottom surfaces of the second plurality of CNTs are substantially coplanar with a bottom surface of the second insulating interlayer.

3. The semiconductor device of claim 1, wherein an upper sidewall of the at least one of the first plurality of CNTs and a lower sidewall of the at least one of the second plurality of CNTs contact each other.

4. The semiconductor device of claim 3, wherein heights of top surfaces of the first plurality of CNTs are higher than that of a top surface of the first insulating interlayer, and heights of bottom surfaces of the second plurality of CNTs are lower than that of a bottom surface of the second insulating interlayer.

5. The semiconductor device of claim 1, wherein a top surface of the first conductive pattern and a bottom surface of the second conductive pattern contact each other.

6. The semiconductor device of claim 1, wherein a first air gap is present between the first and second conductive patterns.

7. The semiconductor device of claim 1, further comprising:
   a first barrier pattern covering a lower surface and a sidewall of the first conductive pattern; and
   a second barrier pattern covering an upper surface and a sidewall of the second conductive pattern.

8. The semiconductor device of claim 7, wherein bottom surfaces of the first plurality of CNTs contact a surface of the first barrier pattern, and top surfaces of the second plurality of CNTs contact a surface of the second barrier pattern.

9. The semiconductor device of claim 5, further comprising:
   a first insulation pattern contained at an upper portion of the first insulating interlayer;
   a third plurality of CNTs extending in the vertical direction, at least a portion of a sidewall of each of the third plurality of CNTs being covered by the first insulation pattern;

a second insulation pattern contained at a lower portion of the second insulating interlayer; and
a fourth plurality of CNTs extending in the vertical direction, at least a portion of a sidewall of each of the fourth plurality of CNTs being covered by the second insulation pattern,
wherein the first and second insulation patterns face each other in the vertical direction, and at least one of the third plurality of CNTs and at least one of the fourth plurality of CNTs contact each other.

10. The semiconductor device of claim 9, wherein a top surface of the first insulation pattern and a bottom surface of the second insulation pattern contact each other.

11. The semiconductor device of claim 9, wherein a second air gap is present between the first and second insulation patterns.

12. The semiconductor device of claim 1, wherein the first and second insulating interlayers include at least substantially the same material, and the first and second conductive patterns includes at least substantially the same material.

13. A semiconductor device, comprising:
a first conductive pattern contained at an upper portion of a first insulating interlayer on a first substrate;
a first plurality of carbon nanotubes (CNTs) on a first recess on an upper surface of the first conductive pattern, each of the first plurality of CNTs extending in a vertical direction relative to an upper surface of the first substrate;
a second conductive pattern contained at a lower portion of a second insulating interlayer beneath a second substrate, a lower surface of the second insulating interlayer contacting an upper surface of the first insulating interlayer; and
a second plurality of CNTs beneath a second recess beneath a lower surface of the second conductive pattern, each of the second plurality of CNTs extending in the vertical direction,
wherein the first and second conductive patterns face each other in the vertical direction, wherein a top surface of at least one of the first plurality of CNTs is spaced apart from the second conductive pattern and at least one of the first plurality of CNTs and at least one of the second plurality of CNTs contact each other.

14. The semiconductor device of claim 13, wherein a top surface of the at least one of the first plurality of CNTs and a bottom surface of the at least one of the second plurality of CNTs contact each other.

15. The semiconductor device of claim 13, wherein an upper sidewall of the at least one of the first plurality of CNTs and a lower sidewall of the at least one of the second plurality of CNTs contact each other.

16. The semiconductor device of claim 13, further comprising:
a first insulation pattern contained at an upper portion of the first insulating interlayer;
a third plurality of CNTs extending in the vertical direction, at least a portion of a sidewall of each of the third plurality of CNTs being covered by the first insulation pattern;
a second insulation pattern contained at a lower portion of the second insulating interlayer; and
a fourth plurality of CNTs extending in the vertical direction, at least a portion of a sidewall of each of the fourth plurality of CNTs being covered by the second insulation pattern,
wherein the first and second insulation patterns face each other in the vertical direction, and at least one of the third plurality of CNTs and at least one of the fourth plurality of CNTs contact each other.

17. A semiconductor device, comprising:
a first conductive pattern;
a first plurality of carbon nanotubes (CNTs) extending through the first conductive pattern in a vertical direction, each of the first plurality of CNTs protruding from an upper surface of the first conductive pattern;
a second conductive pattern; and
a second plurality of CNTs extending through the second conductive pattern in the vertical direction, each of the second plurality of CNTs protruding from a lower surface of the second conductive pattern,
wherein an upper portion of at least one of the first plurality of CNTs and a lower portion of at least one of the second plurality of CNTs contact each other.

18. The semiconductor device of claim 17, wherein an upper sidewall of the at least one of the first plurality of CNTs and a lower sidewall of the at least one of the second plurality of CNTs contact each other.

19. The semiconductor device of claim 17, wherein an air gap is present between the first and second conductive patterns.

* * * * *